US012562549B2

(12) United States Patent　　　　　(10) Patent No.:　US 12,562,549 B2
Kawashima et al.　　　　　　　　　　(45) Date of Patent:　Feb. 24, 2026

(54) LIGHT EMITTING ELEMENT, LIGHT SOURCE DEVICE, DISPLAY DEVICE, HEAD-MOUNTED DISPLAY, AND BIOLOGICAL INFORMATION ACQUISITION APPARATUS

(71) Applicants: Takeshi Kawashima, Miyagi (JP); Shunichi Sato, Miyagi (JP); Morimasa Kaminishi, Miyagi (JP)

(72) Inventors: Takeshi Kawashima, Miyagi (JP); Shunichi Sato, Miyagi (JP); Morimasa Kaminishi, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 387 days.

(21) Appl. No.: 18/121,009

(22) Filed: Mar. 14, 2023

(65) Prior Publication Data

US 2023/0299561 A1　　Sep. 21, 2023

(30) Foreign Application Priority Data

Mar. 18, 2022　(JP) ................................. 2022-044645

(51) Int. Cl.
*H01S 5/183*　　　(2006.01)
*G06V 40/19*　　　(2022.01)
(52) U.S. Cl.
CPC .......... *H01S 5/18361* (2013.01); *G06V 40/19* (2022.01); *H01S 5/18308* (2013.01)
(58) Field of Classification Search
CPC ............ H01S 5/18311; H01S 5/18341; H01S 5/18347; H01S 5/18355; H01S 5/18377;
(Continued)

(56) References Cited

U.S. PATENT DOCUMENTS

2006/0269218 A1*　11/2006　Hasegawa .............. G11B 5/314
2011/0116147 A1　　5/2011　Motomura et al.
(Continued)

FOREIGN PATENT DOCUMENTS

EP　　　0 458 493 A2　　11/1991
JP　　　H04-229688 A　　8/1992
(Continued)

OTHER PUBLICATIONS

Extended European Search Report issued Jul. 25, 2023 in European Patent Application No. 23162058.4, 11 pages.
(Continued)

*Primary Examiner* — Akwasi M Sarpong
*Assistant Examiner* — Michael L Burleson
(74) *Attorney, Agent, or Firm* — XSENSUS LLP

(57)　　　　　ABSTRACT

A light emitting element includes an active layer; and a first reflecting mirror over the active layer. The first reflecting mirror includes a multilayer-film reflecting mirror and a first layer on a first surface. The multilayer-film reflecting mirror has the first surface and a second surface closer to the active layer than the first surface, and includes a first refractive-index layer having a first refractive index; and a second refractive-index layer having a second refractive index higher than the first refractive index. The first refractive-index layer and the second refractive-index layer are alternately stacked. The first surface has an emission region from which the light generated in the active layer is emitted. The first layer is in the emission region of the first surface and is configured to absorb a portion of the light emitted from the first surface and transmit another portion of the light through the first layer.

19 Claims, 18 Drawing Sheets

(58) Field of Classification Search
CPC ............. H01S 5/18394; H01S 5/18375; H01S
5/18369; H01S 5/34326; H01S 5/34333;
H01S 2301/166
See application file for complete search history.

(56) References Cited

U.S. PATENT DOCUMENTS

| | | | |
|---|---|---|---|
| 2011/0128343 A1 | 6/2011 | Sato et al. | |
| 2011/0170155 A1 | 7/2011 | Jikutani et al. | |
| 2011/0261850 A1 | 10/2011 | Shouji et al. | |
| 2012/0106587 A1* | 5/2012 | Matsuu | H01S 5/0654 |
| | | | 372/107 |
| 2012/0237261 A1* | 9/2012 | Ikuta | H01S 5/18391 |
| | | | 372/66 |
| 2014/0241391 A1* | 8/2014 | Abe | H10H 20/042 |
| | | | 372/45.01 |
| 2019/0254597 A1* | 8/2019 | Hamade | A61B 5/1455 |
| 2019/0273360 A1 | 9/2019 | Kawashima et al. | |
| 2021/0336421 A1 | 10/2021 | Kawashima | |

FOREIGN PATENT DOCUMENTS

| | | |
|---|---|---|
| JP | 2001-284722 | 10/2001 |
| JP | 2008-227404 A | 9/2008 |
| JP | 2010-040602 A | 2/2010 |
| JP | 2019-153779 | 9/2019 |
| JP | 2021-176194 | 11/2021 |

OTHER PUBLICATIONS

Hasnain G, et al., "Continuous Wave Top Surface Emitting Quantum Well Lasers Using Hybrid Metal/Semiconductor Reflectors", Electronics Letters, vol. 26, No. 19, Sep. 13, 1990, 3 pages, XP000119700.
Office Action issued Dec. 2, 2025 in Japanese Patent Application No. 2022-044645, 7 pages.

* cited by examiner

THICKNESS OF Cr LAYER (nm)

|  | 8.5 PERIODS |
| --- | --- |
| | 8.5 PERIODS − 0.15 $\lambda$ |
| | 8.5 PERIODS − 0.20 $\lambda$ |
| | 8.5 PERIODS − 0.225 $\lambda$ |
| | 8.5 PERIODS − 0.2375 $\lambda$ |
| | 8.5 PERIODS − 0.25 $\lambda$ (8.0 PERIODS) |

THICKNESS OF Cr LAYER (nm)

|  | 8.5 PERIODS |
| --- | --- |
| | 8.5 PERIODS + 0.050 $\lambda$ |
| | 8.5 PERIODS + 0.100 $\lambda$ |
| | 8.5 PERIODS + 0.125 $\lambda$ |
| | 8.5 PERIODS + 0.130 $\lambda$ |
| | 8.5 PERIODS + 0.140 $\lambda$ |
| | 8.5 PERIODS + 0.150 $\lambda$ |

FIG. 12

REFLECTIVITY (Cr LAYER)
TRANSMISSIVITY (Cr LAYER)
REFLECTIVITY (Al LAYER)
TRANSMISSIVITY (Al LAYER)

REFLECTIVITY (Cr LAYER)
TRANSMISSION RATIO (Cr LAYER)
REFLECTIVITY (Al LAYER)
TRANSMISSION RATIO (Al LAYER)

FIG. 15

THICKNESS OF Cr LAYER (nm)

——— 10.5 PERIODS
------ 11 PERIODS
·········· 10 PERIODS

FIG. 23

LIGHT EMITTING ELEMENT, LIGHT SOURCE DEVICE, DISPLAY DEVICE, HEAD-MOUNTED DISPLAY, AND BIOLOGICAL INFORMATION ACQUISITION APPARATUS

CROSS-REFERENCE TO RELATED APPLICATIONS

This patent application is based on and claims priority pursuant to 35 U.S.C. § 119(a) to Japanese Patent Application No. 2022-044645, filed on Mar. 18, 2022, in the Japan Patent Office, the entire disclosure of which is hereby incorporated by reference herein.

BACKGROUND

Technical Field

The present disclosure relates to a light emitting element, a light source device, a display device, a head-mounted display, and a biological information acquisition apparatus.

Related Art

A vertical cavity surface emitting laser (VCSEL) in which a resonator is formed in the vertical direction is known. The VCSEL has a small active-layer volume, a low threshold value, and a low power consumption. The VCSEL includes elements each having an output of about several hundreds of microwatts to about several milliwatts. The elements may be arranged in an array to provide a large output. Since the VCSEL has device characteristics of a low output and a low power consumption, the VCSEL is expected to be applied to a light source for a retinal scanning display as a light source of a wearable device, or a light source for biometrics for acquiring iris information using the low output.

SUMMARY

Embodiments of the present disclosure provide a light emitting element includes an active layer configured to generate light; and a first reflecting mirror over the active layer. The first reflecting mirror includes a multilayer-film reflecting mirror and a first layer. The multilayer-film reflecting mirror has a first surface and a second surface opposite to the first surface and closer to the active layer than the first surface. The multilayer-film reflecting mirror includes a first refractive-index layer having a first refractive index; and a second refractive-index layer having a second refractive index higher than the first refractive index. The first refractive-index layer and the second refractive-index layer are alternately stacked. The first layer is on the first surface of the multilayer-film reflecting mirror. The first surface has an emission region from which the light generated in the active layer is emitted. The first layer is in the emission region of the first surface and is configured to absorb a portion of the light emitted from the first surface and transmit another portion of the light through the first layer.

Embodiments of the present disclosure provide a light source device including the light emitting element.

Embodiments of the present disclosure provide a display device including the light emitting element.

Embodiments of the present disclosure provide a head-mounted display including the light emitting element.

Embodiments of the present disclosure provide a biological information acquisition apparatus including a light source device that irradiates a living body with light; a light receiving device that receives reflected light from the living body; and an information acquirer that acquires information on the living body based on an output of the light receiving device. The light source device includes the light emitting element.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein:

FIG. 12 is a cross-sectional schematic view illustrating a surface emitting laser according to a fifth embodiment;

FIG. 15 is a cross-sectional schematic view illustrating a surface emitting laser according to a sixth embodiment;

FIG. 23 is an illustration of an example configuration of a biometric authentication apparatus according to a tenth embodiment.

Figure 1:
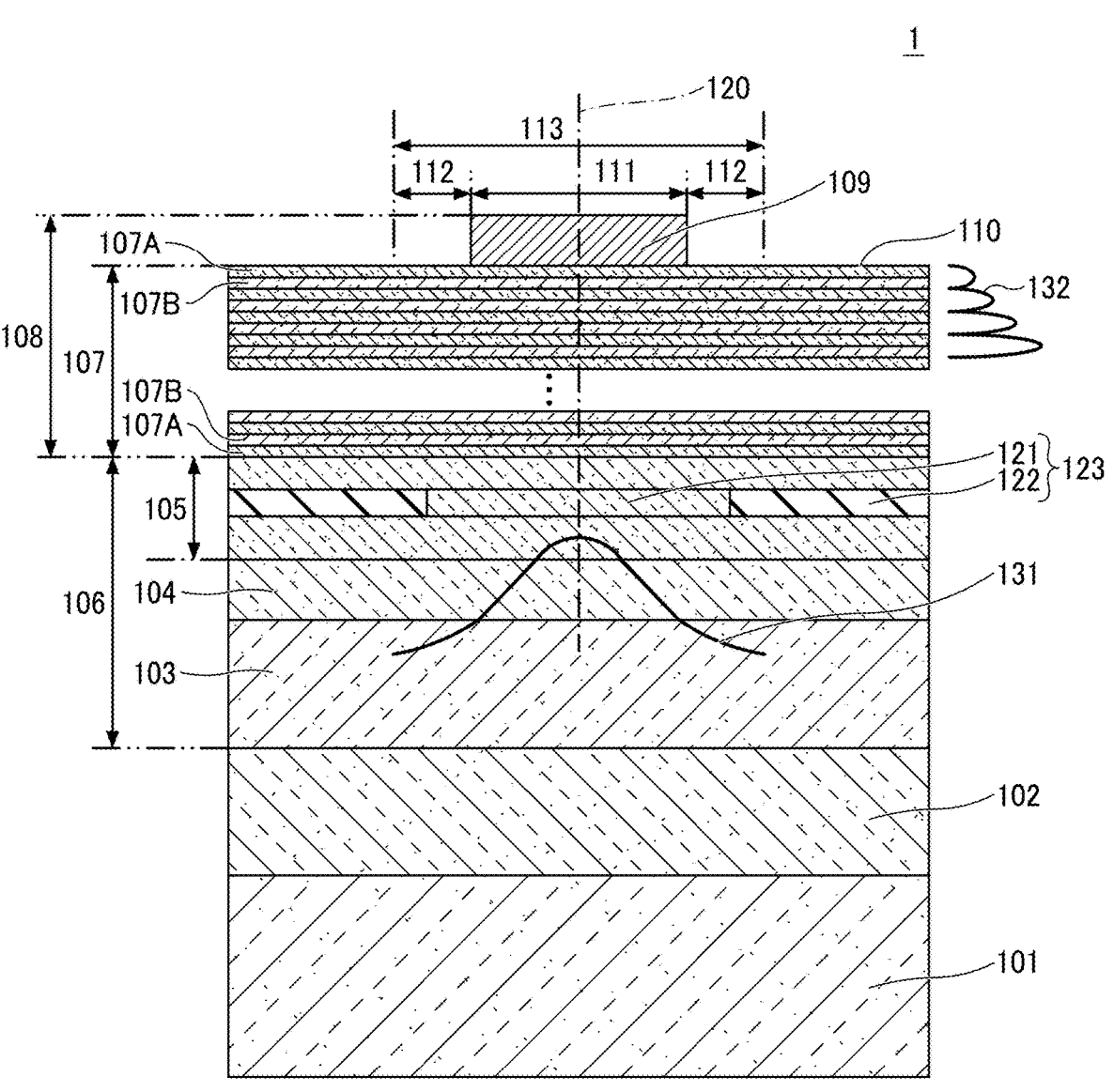
FIG. 1 is a cross-sectional schematic view illustrating a surface emitting laser according to a first embodiment.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

The maximum exposure limit of the retina is several tens of microwatts to several hundreds of microwatts, although the maximum exposure limit varies depending on the wavelength. When the VCSEL is used as a retinal display or a light source for biometrics, the optical output is further reduced to, for example, about 0.05 μW to about 0.2 μW. The optical output of the VCSEL of related art is about several hundreds of microwatts to about several milliwatts, and the VCSEL of the related art is not to be directly used as an eye-safe light source. For example, to use the VCSEL as an eye-safe light source, the optical output is desirably suppressed by several orders of magnitude or more as compared to the related art.

There are several methods of suppressing the optical output of the VCSEL.

The simplest method is a method of providing a component such as a neutral density (ND) filter to reduce the optical output in the middle of the optical path. However, with this method, light exceeding the exposure limit may be incident on the retina at a fault such as lack of a component.

Another method is a method of finely controlling the current in a weak output portion near the threshold current of the VCSEL. With this method, light with an extremely low output may be output; however, it is difficult to control a very small current, and it is difficult to stably operate the element.

Still another method is a method of increasing the reflectivity of a reflecting mirror on a light extraction side to 99.99% or more in element design. This method can theoretically decrease the optical output to about several tens of microwatts. However, to further reduce the optical output by one to two orders of magnitude, the reflectivity of the reflecting mirror is to be further increased, and it is very difficult to increase the reflectivity to this level.

With the disclosed technology, a light source with a low output can be provided. Embodiments of the present disclosure are described below with reference to the accompanying drawings. Note that in the description and the drawings of the embodiments of the present disclosure, like reference signs are given to elements with substantially the same functional configuration. Accordingly, overlapping descriptions are omitted where appropriate.

The embodiments described below are illustrative of a surface emitting laser being an example of a light emitting element for embodying the technical idea of the disclosure, a light source device, a display device, a head-mounted display, and a biological information acquisition apparatus, and the embodiments do not limit the disclosure.

First Embodiment

A first embodiment is described first. The first embodiment relates to a surface emitting laser. FIG. 1 is a cross-sectional schematic view illustrating a surface emitting laser 1 according to the first embodiment.

As illustrated in FIG. 1, the surface emitting laser 1 according to the first embodiment includes a substrate 101, a lower reflecting mirror 102 (second reflecting mirror), a lower spacer layer 103, an active layer 104, an upper spacer layer 105, and an upper reflecting mirror 108 (first reflecting mirror). The upper reflecting mirror 108 includes a multilayer-film reflecting mirror 107 and a metal layer 109. The metal layer 109 is an example of a first layer. The lower reflecting mirror 102 is provided on the substrate 101. The lower spacer layer 103 is provided on the lower reflecting mirror 102. The active layer 104 is provided on the lower spacer layer 103. The upper spacer layer 105 is provided on the active layer 104. The multilayer-film reflecting mirror 107 is provided on the upper spacer layer 105. The metal layer 109 is provided on the multilayer-film reflecting mirror 107. The multilayer-film reflecting mirror 107 includes a low refractive-index layer 107A and a high refractive-index layer 107B. The low refractive-index layer 107A and the high refractive-index layer 107B are alternately stacked. The low refractive-index layer 107A has a first refractive index. The high refractive-index layer 107B has a second refractive index higher than the first refractive index. The lower spacer layer 103, the active layer 104, and the upper spacer layer 105 define a resonator 106. The metal layer 109 is provided on an emission surface 110 of the multilayer-film reflecting mirror 107. The emission surface 110 is located on a side opposite to the resonator 106.

The upper spacer layer 105 includes a current confinement layer 123. The current confinement layer 123 includes a conductive region 121 and an insulating region 122. The conductive region 121 is surrounded by the insulating region 122.

The current confinement layer 123 limits a region in the active layer 104 through which a current flows. When carriers are injected into the active layer 104, a standing wave 132 of light is generated in a direction perpendicular to a substrate surface (principal surface) of the substrate 101 with a wavelength determined by the resonator 106. The conductive region 121 has, for example, a circular planar shape in a plan view in a direction perpendicular to the emission surface 110 of the multilayer-film reflecting mirror 107. In the first embodiment, light is emitted toward the multilayer-film reflecting mirror 107 while the center of a region in which the active layer 104 and the conductive region 121 overlap in a plan view serves as an emission center 120.

FIG. 1 schematically illustrates the positions of an antinode and a node of the standing wave 132. When k is a wavelength of the standing wave 132 determined by the resonator 106, the total thickness of one period (one pair) of the low refractive-index layer 107A and the high refractive-index layer 107B corresponds to an optical thickness of $\lambda/2$.

For example, the optical thickness of each of the low refractive-index layer 107A and the high refractive-index layer 107B is λ/4. In the first embodiment, a node of the standing wave 132 is at the emission surface 110 of the multilayer-film reflecting mirror 107. For example, the low refractive-index layer 107A having the optical thickness of λ/4 defines the emission surface 110. That is, the multilayer-film reflecting mirror 107 is terminated at the low refractive-index layer 107A in an emission direction of light. For example, the multilayer-film reflecting mirror 107 includes a number N of high refractive-index layers 107B and a number N+1 of low refractive-index layers 107A (N being a natural number).

The emission surface 110 of the multilayer-film reflecting mirror 107 has an emission region 113 from which light generated in the active layer 104 is emitted. The emission region 113 includes a first region 111 and a second region 112 located around the first region 111. For example, the second region 112 surrounds the first region 111. For example, the first region 111 is a circular region, and the second region 112 is a ring-shaped region. The first region 111 preferably includes the emission center 120 in a plan view of the multilayer-film reflecting mirror 107 and is a region in which the light intensity (electric field intensity) of a fundamental mode 131 in a transverse direction including the emission center 120 is high.

The metal layer 109 is provided in the first region 111, and absorbs a portion of the light generated in the active layer 104. The material of the metal layer 109 is not limited, and, for example, a material that can absorb light with a desirable thickness is used. The material of the metal layer 109 may be a metal having a high reflectivity in the entire visible range, such as aluminum (Al) or silver (Ag), or may be a metal having a low reflectivity, such as chromium (Cr). Since the upper reflecting mirror 108 includes the metal layer 109, the output of the surface emitting laser 1 can be 0.01 µW or more and less than 100 µW, more preferably 0.01 µW or more and less than 50 µW, or further preferably 0.01 µW or more and less than 1 µW.

To perform scanning with light and control the light to form an image, a single-mode operation is desirable. In the first embodiment, the reflectivity of a portion of the upper reflecting mirror 108 overlapping the first region 111 in a plan view as viewed from the active layer 104 is higher than the reflectivity of a portion of the upper reflecting mirror 108 overlapping the second region 112 in the plan view as viewed from the active layer 104. Thus, the oscillation threshold value of a high-order mode is higher than the oscillation threshold value of a single mode in an in-plane transverse direction, and the surface emitting laser 1 operates in the single mode. Also, since the metal layer 109 absorbs the portion of the light, the optical output of the surface emitting laser 1 can be suppressed. For example, the optical output of the surface emitting laser 1 can be about sub-microwatts to about several tens of microwatts, which is suitable for eye-safe use. That is, according to the first embodiment, both eye-safe use and single-mode operation by reducing the output can be attained.

In other words, the light emitting element (1; 2; 3; 4; 5; 6 or 7) is a surface emitting laser and further includes: a resonator (106; 406 or 706) between the first reflecting mirror (108; 208; 308; 408; 508; 608; or 708) and the second reflecting mirror (102; 402; or 702), the resonator (106; 406; or 706) including the active layer (104; 404; or 704); and a second reflecting mirror (102; 402; or 702). The emission region includes: a first region including the emission center at a center of the multilayer-film reflecting mirror (107; 207;

307; 407; 507; 607; or 707) in a plan view of the multilayer-film reflecting mirror (107; 207; 307; 407; 507; 607; or 707) from a direction orthogonal to the first surface; and a second region around the first region. The first layer is in the first region, and a first reflectivity of a portion of the first reflecting mirror (108; 208; 308; 408; 508; 608; or 708) overlapping the first region is higher than a second reflectivity of another portion of the first reflecting mirror (108; 208; 308; 408; 508; 608; or 708) overlapping the second region in the plan view as viewed from the active layer (104; 404; or 704).

Figure 2:
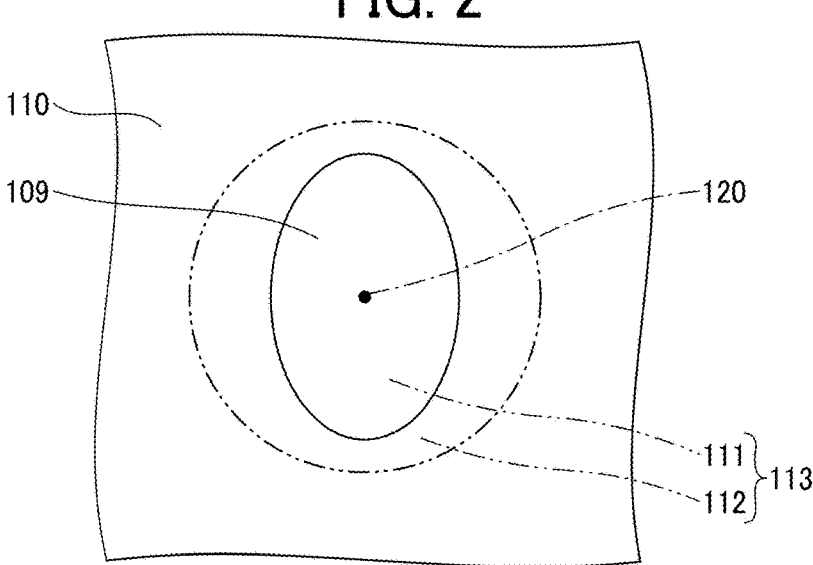
FIG. 2 is a plan view illustrating an example of a first region and a metal layer.

The planar shapes of the first region 111 and the metal layer 109 are not limited to circular shapes. FIG. 2 is a plan view illustrating an example of the first region 111 and the metal layer 109. As in the example illustrated in FIG. 2, the planar shapes of the first region 111 and the metal layer 109 may be elliptic shapes. As described above, since the planar shapes of the first region 111 and the metal layer 109 have anisotropy in two directions orthogonal to each other in an in-plane direction, polarization can be controlled. The planar shapes of the first region 111 and the metal layer 109 may be rectangular shapes or more complicated shapes. The metal layer 109 functions as a high-order mode filter having such in-plane anisotropy. Since the metal layer 109 that functions as the high-order mode filter is provided, the area of the first region 111 can be increased and the resistance of the element can be decreased as compared to a case without the high-order mode filter. The same applies to the following embodiments and modifications.

It is sufficient that a node of the standing wave 132 is at the emission surface 110 of the multilayer-film reflecting mirror 107, and the multilayer-film reflecting mirror 107 does not have to be terminated at the low refractive-index layer 107A in the emission direction of light. For example, the multilayer-film reflecting mirror 107 may be terminated at a high refractive-index layer having an optical thickness of λ/2.

The current confinement layer 123 may be provided in the multilayer-film reflecting mirror 107 instead of being provided in the upper spacer layer 105. The same applies to the following embodiments and modifications.

A metal layer thinner than the metal layer 109 may be provided around the metal layer 109.

Second Embodiment

Figure 3:
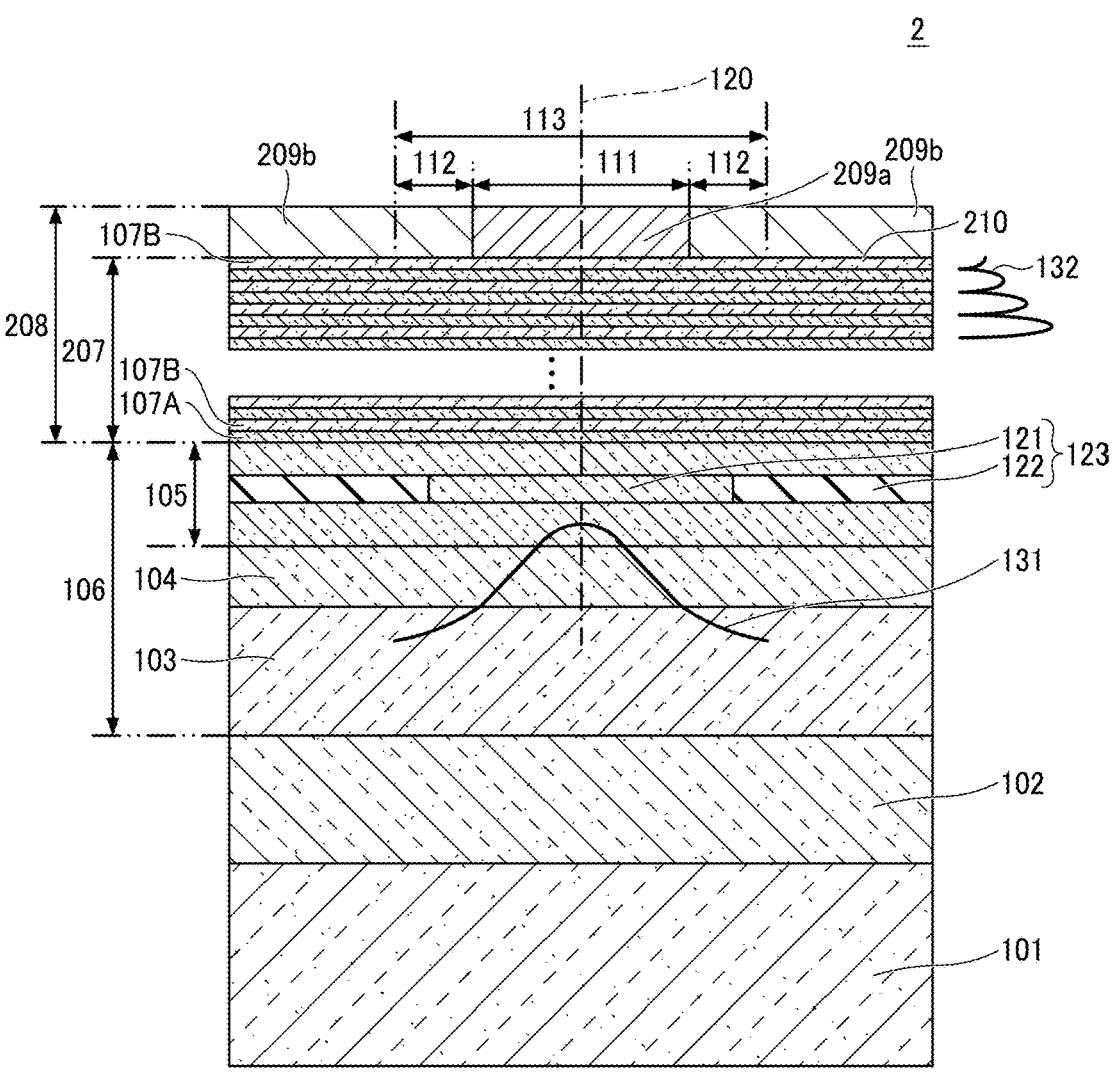
FIG. 3 is a cross-sectional schematic view illustrating a surface emitting laser according to a second embodiment.

A second embodiment is described next. The second embodiment differs from the first embodiment mainly for the configuration of an upper reflecting mirror. FIG. 3 is a cross-sectional schematic view illustrating a surface emitting laser 2 according to the second embodiment.

As illustrated in FIG. 3, the surface emitting laser 2 according to the second embodiment includes an upper reflecting mirror 208 (first reflecting mirror) instead of the upper reflecting mirror 108. The upper reflecting mirror 208 includes a multilayer-film reflecting mirror 207, a metal layer 209a, and a metal layer 209b. The metal layer 209a is an example of a first layer. The metal layer 209b is an example of a second layer. The multilayer-film reflecting mirror 207 is provided on the upper spacer layer 105. The metal layers 209a and 209b are provided on the multilayer-film reflecting mirror 207. The metal layers 209a and 209b are provided on an emission surface 210 of the multilayer-film reflecting mirror 207. The emission surface 210 is located on a side opposite to the resonator 106.

FIG. 3 schematically illustrates the positions of an antinode and a node of a standing wave 132. In the second embodiment, an antinode of the standing wave 132 is at the emission surface 210 of the multilayer-film reflecting mirror 207. For example, a high refractive-index layer 107B having an optical thickness of λ/4 defines the emission surface 210. That is, the multilayer-film reflecting mirror 207 is terminated at the high refractive-index layer 107B in an emission direction of light. For example, the multilayer-film reflecting mirror 207 includes a number N of high refractive-index layers 107B and a number N of low refractive-index layers 107A.

The emission surface 210 of the multilayer-film reflecting mirror 207 has an emission region 113, and the emission region 113 includes a first region 111 and a second region 112, similarly to the first embodiment. The metal layer 209a is provided in the first region 111, and absorbs a portion of light generated in the active layer 104. The metal layer 209b is provided in the second region 112, and absorbs a portion of the light generated in the active layer 104. The refractive index of the metal layer 209a is lower than the refractive index of the metal layer 209b. The materials of the metal layers 209a and 209b are not limited as long as the refractive index of the metal layer 209a is lower than the refractive index of the metal layer 209b. The metal layer 209b may be provided also outside the emission region 113 in a plan view.

The other configurations are similar to those in the first embodiment.

In the second embodiment, the reflectivity of a portion of the upper reflecting mirror 208 overlapping the first region 111 in a plan view as viewed from the active layer 104 is higher than the reflectivity of a portion of the upper reflecting mirror 208 overlapping the second region 112 in the plan view as viewed from the active layer 104. Thus, similarly to the first embodiment, the oscillation threshold value of a high-order mode is higher than the oscillation threshold value of a single mode in an in-plane transverse direction, and the surface emitting laser 2 operates in the single mode. Also, since the metal layers 209a and 209b absorb the portions of the light, the optical output of the surface emitting laser 2 can be suppressed. For example, the optical output of the surface emitting laser 2 can be about sub-microwatts to about several tens of microwatts, which is suitable for eye-safe use. That is, even with the second embodiment, both eye-safe use and single-mode operation can be attained.

The materials of the metal layers 209a and 209b may be of the same kind as long as the reflectivity of the portion of the upper reflecting mirror 208 overlapping the first region 111 in the plan view as viewed from the active layer 104 is higher than the reflectivity of the portion of the upper reflecting mirror 208 overlapping the second region 112 in the plan view as viewed from the active layer 104. For example, when the metal layer 209a is thicker than the metal layer 209b, the reflectivity of the portion of the upper reflecting mirror 208 overlapping the first region 111 in the plan view as viewed from the active layer 104 is higher than the reflectivity of the portion of the upper reflecting mirror 208 overlapping the second region 112 in the plan view as viewed from the active layer 104. When the difference between the refractive indices of the metal layers 209a and 209b is small, the difference between the reflectivities can be increased as long as the metal layer 209a is thicker than the metal layer 209b. When the difference between the refractive indices of the metal layers 209a and 209b is large, the metal layer 209a may be thicker than the metal layer 209b.

It is sufficient that an antinode of the standing wave 132 is at the emission surface 210 of the multilayer-film reflecting mirror 207, and the multilayer-film reflecting mirror 207 does not have to be terminated at the high refractive-index layer 107B in the emission direction of light. For example, the multilayer-film reflecting mirror 207 may be terminated at a low refractive-index layer having an optical thickness of λ/2.

Third Embodiment

Figure 4:
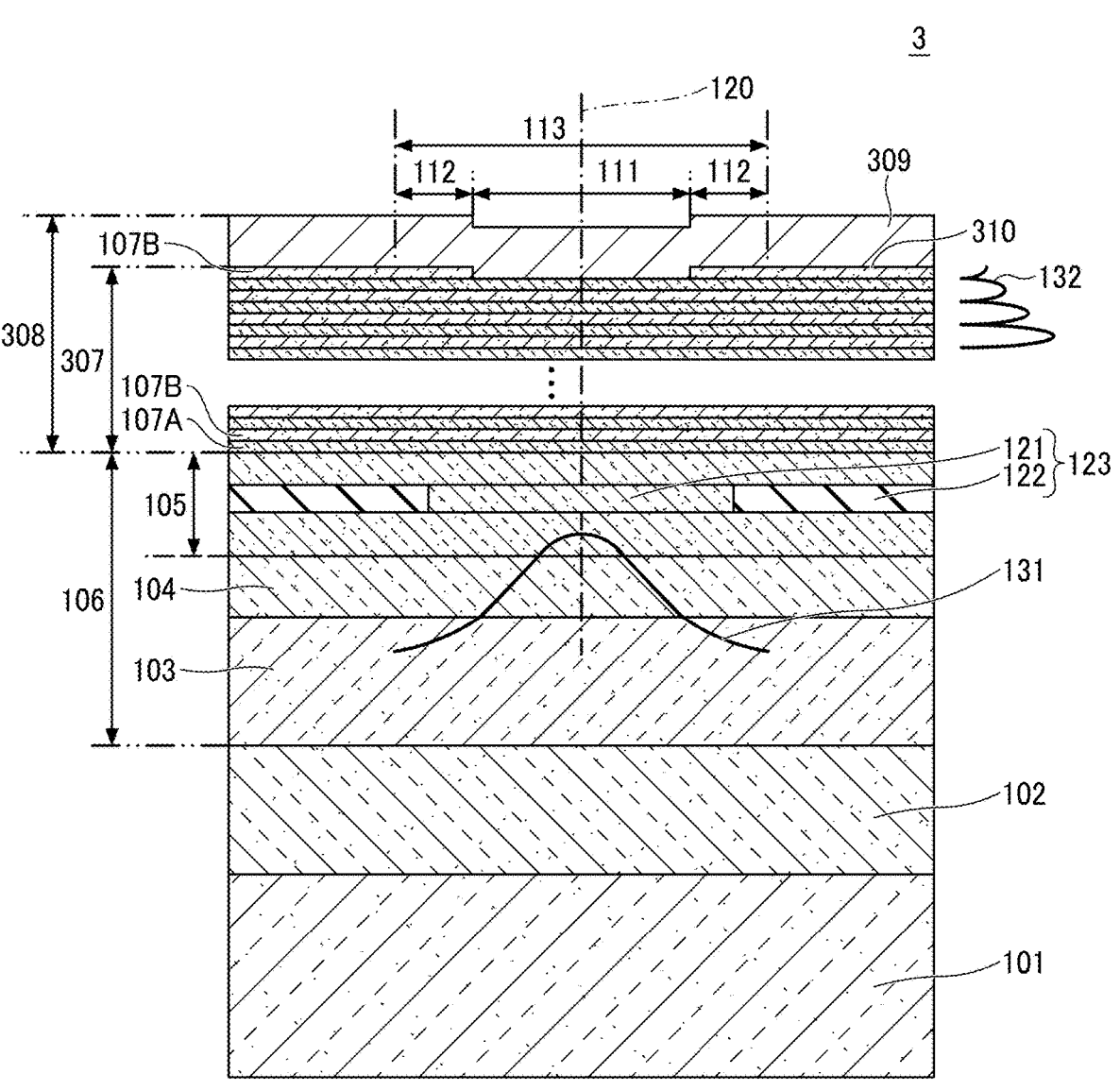
FIG. 4 is a cross-sectional schematic view illustrating a surface emitting laser according to a third embodiment.

A third embodiment is described next. The third embodiment differs from the first embodiment and so forth mainly for the configuration of an upper reflecting mirror. FIG. 4 is a cross-sectional schematic view illustrating a surface emitting laser 3 according to the third embodiment.

As illustrated in FIG. 4, the surface emitting laser 3 according to the third embodiment includes an upper reflecting mirror 308 (first reflecting mirror) instead of the upper reflecting mirror 108. The upper reflecting mirror 308 includes a multilayer-film reflecting mirror 307 and a metal layer 309. The multilayer-film reflecting mirror 307 is provided on the upper spacer layer 105. The metal layer 309 is provided on the multilayer-film reflecting mirror 307. The metal layer 309 is provided on an emission surface 310 of the multilayer-film reflecting mirror 307. The emission surface 310 is located on a side opposite to the resonator 106.

FIG. 4 schematically illustrates the positions of an antinode and a node of a standing wave 132. The emission surface 310 of the multilayer-film reflecting mirror 307 has an emission region 113, and the emission region 113 includes a first region 111 and a second region 112, similarly to the first embodiment. In the third embodiment, a node of the standing wave 132 is in the first region 111, and an antinode of the standing wave 132 is in the second region 112 at the emission surface 310 of the multilayer-film reflecting mirror 307. For example, a low refractive-index layer 107A having an optical thickness of λ/4 defines the emission surface 310 in the first region 1, and a high refractive-index layer 107B having an optical thickness of λ/4 defines the emission surface 310 in the second region 112. That is, in an emission direction of light, the multilayer-film reflecting mirror 307 is terminated at the low refractive-index layer 107A in the first region 111, and is terminated at the high refractive-index layer 107B in the second region 112. For example, the multilayer-film reflecting mirror 307 includes a number N of high refractive-index layers 107B and a number N−1 of low refractive-index layers 107A in a portion overlapping the first region 111, and includes a number N of high refractive-index layers 107B and a number N of low refractive-index layers 107A in a portion overlapping the second region 112.

The metal layer 309 is provided in the first region 111 and the second region 112, and absorbs a portion of light generated in the active layer 104. The metal layer 309 may be provided also outside the emission region 113 in a plan view.

In the third embodiment, the reflectivity of a portion of the upper reflecting mirror 308 overlapping the first region 111 in a plan view as viewed from the active layer 104 is higher than the reflectivity of a portion of the upper reflecting mirror 308 overlapping the second region 112 in the plan view as viewed from the active layer 104. Thus, the oscillation threshold value of a high-order mode is higher than the oscillation threshold value of a single mode in an in-plane transverse direction, and the surface emitting laser 3 operates in the single mode. Also, since the metal layer 309 absorbs the portion of the light, the optical output of the surface emitting laser 3 can be suppressed. For example, the optical output of the surface emitting laser 3 can be about sub-microwatts to about several tens of microwatts, which is suitable for eye-safe use. That is, according to the third embodiment, both eye-safe use and single-mode operation can be attained.

The multilayer-film reflecting mirror 307 may include a number N of high refractive-index layers 107B and a number N+1 of low refractive-index layers 107A in the portion overlapping the first region 111, and include a number N of high refractive-index layers 107B and a number N of low refractive-index layers 107A in the portion overlapping the second region 112. Even with this configuration, a node of the standing wave 132 is in the first region 111, and an antinode of the standing wave 132 is in the second region 112 at the emission surface 310 of the multilayer-film reflecting mirror 307.

Fourth Embodiment

Figure 5:
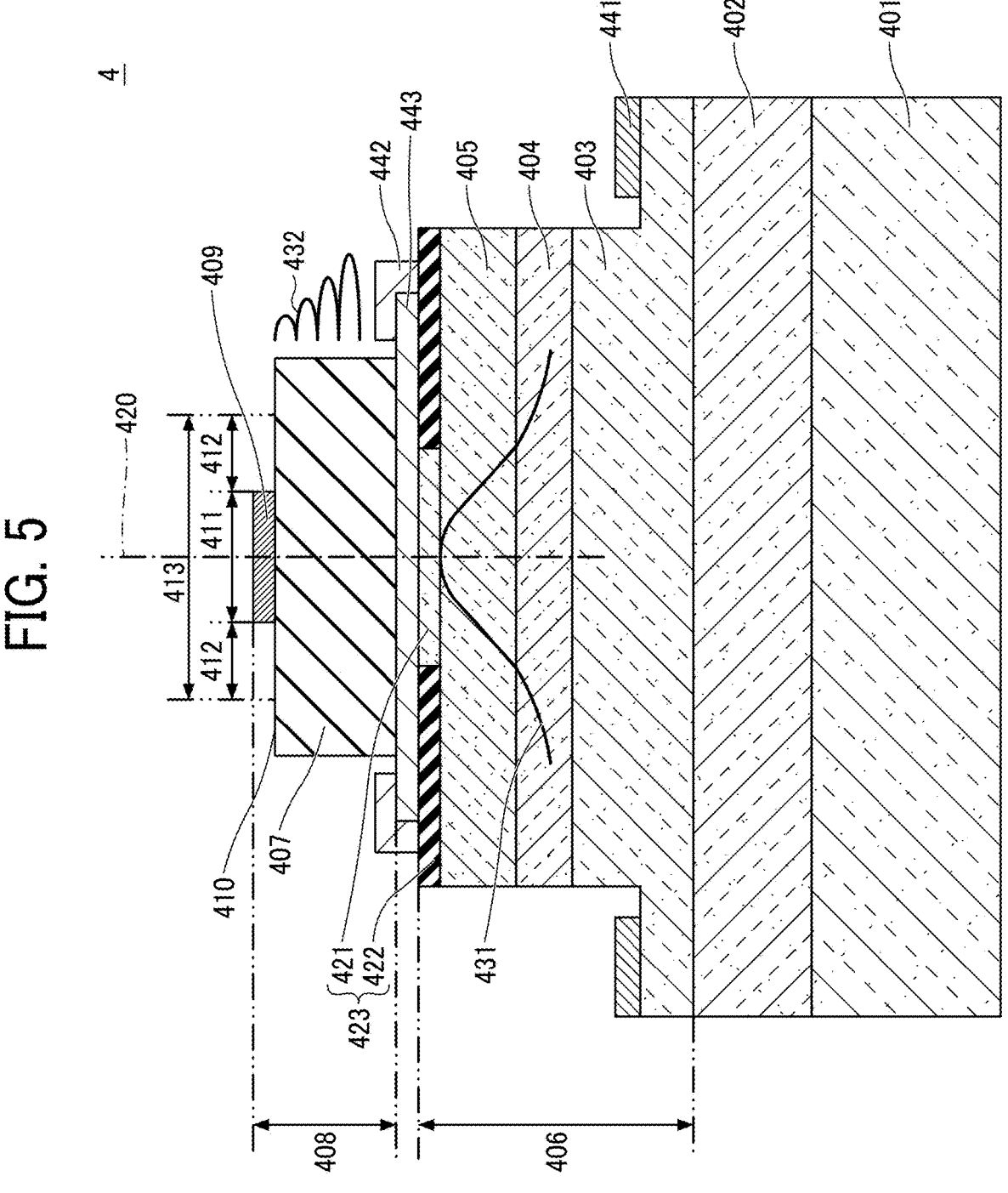
FIG. 5 is a cross-sectional schematic view illustrating a surface emitting laser according to a fourth embodiment.

A fourth embodiment is described next. The fourth embodiment relates to a surface emitting laser. FIG. 5 is a cross-sectional schematic view illustrating a surface emitting laser 4 according to the fourth embodiment. The fourth embodiment corresponds to a specific example of the first embodiment.

The surface emitting laser 4 according to the fourth embodiment is a surface emitting laser that uses gallium nitride (GaN) and has a wavelength $\lambda$ of 445 nm. As illustrated in FIG. 5, the surface emitting laser 4 includes a substrate 401, a lower reflecting mirror 402 (second reflecting mirror), a lower spacer layer 403, an active layer 404, an upper spacer layer 405, and an upper reflecting mirror 408 (first reflecting mirror). The upper reflecting mirror 408 includes a multilayer-film reflecting mirror 407 and a metal layer 409. The surface emitting laser 4 further includes a current confinement layer 423, a transparent conductive layer 443, a lower electrode 441, and an upper electrode 442. The lower reflecting mirror 402 is provided on the substrate 401. The lower spacer layer 403 is provided on the lower reflecting mirror 402. The active layer 404 is provided on the lower spacer layer 403. The upper spacer layer 405 is provided on the active layer 404. The current confinement layer 423 is provided on the upper spacer layer 405. The transparent conductive layer 443 is provided on the current confinement layer 423. The multilayer-film reflecting mirror 407 is provided on the transparent conductive layer 443. The metal layer 409 is provided on the multilayer-film reflecting mirror 407. The lower spacer layer 403, the active layer 404, and the upper spacer layer 405 define a resonator 406. The metal layer 409 is provided on an emission surface 410 of the multilayer-film reflecting mirror 407. The emission surface 410 is located on a side opposite to the resonator 406.

The substrate 401 is, for example, a GaN substrate.

The lower reflecting mirror 402 is, for example, a multilayer-film reflecting mirror including a semiconductor including 45 periods of high refractive-index layers and low refractive-index layers. For example, the high refractive-index layers each are an indium gallium nitride (InGaN) layer, and the low refractive-index layers each are a super-lattice layer including a plurality of aluminum gallium nitride (AlGaN) layers and a plurality of GaN layers. The optical thickness of one period of the high refractive-index layer and the low refractive-index layer is $\lambda/2$.

The multilayer-film reflecting mirror 407 has a configuration similar to that of the multilayer-film reflecting mirror 107. That is, the multilayer-film reflecting mirror 407 includes a low refractive-index layer and a high refractive-index layer, and the low refractive-index layer and the high refractive-index layer are alternately stacked. The low refractive-index layer has a first refractive index. The high refractive-index layer has a second refractive index higher than the first refractive index. The multilayer-film reflecting mirror 407 is, for example, a multilayer-film reflecting mirror including a dielectric body including 8.5 periods of high refractive-index layers and low refractive-index layers. For example, the high refractive-index layers each are a tantalum pentoxide ($Ta_2O_5$) layer, and the low refractive-index layers each are a silicon dioxide ($SiO_2$) layer. The optical thickness of one period of the high refractive-index layer and the low refractive-index layer is $\lambda/2$. For example, the multilayer-film reflecting mirror 407 includes 8 $Ta_2O_5$ layers and 9 $SiO_2$ layers.

The active layer 404 has a multiple quantum well structure including a plurality of InGaN layers and a plurality of GaN layers. The lower spacer layer 403 is an n-type GaN layer. The upper spacer layer 405 is a p-type GaN layer. The upper spacer layer 405, the active layer 404, and a portion of the lower spacer layer 403 are etched to form a mesa structure.

The current confinement layer 423 includes a conductive region 421 and an insulating region 422. The conductive region 421 is surrounded by the insulating region 422. For example, the conductive region 421 is a portion of the upper spacer layer 405 and including p-type GaN, and the insulating region 422 is a $SiO_2$ layer. The current confinement layer 423 limits a region in the active layer 404 through which a current flows. When carriers are injected into the active layer 404, a standing wave 432 of light is generated in a direction perpendicular to a substrate surface (principal surface) of the substrate 401 with a wavelength $\lambda$ (445 nm) determined by the resonator 406. In the fourth embodiment, light is emitted toward the multilayer-film reflecting mirror 407 while the center of a region of the active layer 404 overlapping the conductive region 421 in a plan view serves as an emission center 420.

FIG. 5 schematically illustrates the positions of an antinode and a node of the standing wave 432. In the fourth embodiment, the resonator 406 has a thickness with which the standing wave 432 with the wavelength $\lambda$ of 445 nm is generated. To obtain a high gain, the active layer 404 is situated at an antinode of the standing wave 432 having a high light intensity. To suppress light absorption, the transparent conductive layer 443 is situated at a node of the standing wave 432. Also, a node of the standing wave 432 is at the emission surface 410 of the multilayer-film reflecting mirror 407. For example, a low refractive-index layer having an optical thickness of $\lambda/4$ defines the emission surface 410. That is, the multilayer-film reflecting mirror 407 is terminated at the low refractive-index layer ($SiO_2$ layer) in an emission direction of light.

The emission surface 410 of the multilayer-film reflecting mirror 407 has an emission region 413 from which light generated in the active layer 404 is emitted. The emission region 413 includes a first region 411 including the emission center 420 in a plan view, and a second region 412 located around the first region 411. For example, the second region 412 surrounds the first region 411. For example, the first region 411 is a circular region, and the second region 412 is a ring-shaped region. The first region 411 is a region in which the light intensity of a fundamental mode 431 in a transverse direction including the emission center 420 is high.

The metal layer 409 is provided in the first region 411, and absorbs a portion of the light generated in the active layer 404. The metal layer 409 is, for example, a Cr layer. The metal layer 409 has a thickness of, for example, 20 nm.

The material of the transparent conductive layer 443 is, for example, indium tin oxide (ITO). The lower electrode 441 is provided on the lower spacer layer 403, around the mesa structure. The lower electrode 441 includes a titanium (Ti) layer formed on the lower spacer layer 403 and an Al layer on the Ti layer. The upper electrode 442 includes a Ti layer formed on the transparent conductive layer 443 and a gold (Au) layer on the Ti layer. When a voltage is applied between the lower electrode 441 and the upper electrode 442, a current flows through the active layer 404.

In the fourth embodiment, the reflectivity of a portion of the upper reflecting mirror 408 overlapping the first region 411 in a plan view as viewed from the active layer 404 is higher than the reflectivity of a portion of the upper reflecting mirror 408 overlapping the second region 412 in the plan view as viewed from the active layer 404. For example, the reflectivity of the portion of the upper reflecting mirror 408 overlapping the first region 411 in the plan view as viewed from the active layer 404 is 0.9991, and the reflectivity of the portion of the upper reflecting mirror 408 overlapping the second region 412 in the plan view as viewed from the active layer 404 is 0.9954. Thus, the oscillation threshold value of a high-order mode is higher than the oscillation threshold value of a single mode in an in-plane transverse direction, and the surface emitting laser 4 operates in the single mode. Also, since the metal layer 409 absorbs the portion of the light, the optical output of the surface emitting laser 4 can be suppressed. For example, the optical output of the surface emitting laser 4 can be about sub-microwatts to about several tens of microwatts, which is suitable for eye-safe use. That is, according to the fourth embodiment, both eye-safe use and single-mode operation can be attained.

A method for manufacturing the surface emitting laser 4 according to the fourth embodiment is described next.

First, the lower reflecting mirror 402, the lower spacer layer 403, the active layer 404, and the upper spacer layer 405 are formed on the substrate 401 using a metal organic chemical vapor deposition (MOCVD) apparatus. Then, an impurity included in the upper spacer layer 405 is activated by heat treatment. For example, the heat treatment heats the substrate 401.

Then, a mesa structure is formed in the upper spacer layer 405, the active layer 404, and a portion of the lower spacer layer 403 by photolithography and dry etching so that a portion of the lower spacer layer 403 remains in a thickness direction.

Then, a peripheral edge portion of the upper spacer layer 405 is removed to a depth of about 20 nm by photolithography and dry etching. Then, a $SiO_2$ layer is formed as the insulating region 422 through self-alignment using the mask used for the dry etching. The $SiO_2$ layer can be formed by, for example, electron-beam (EB) vapor deposition. In this way, the current confinement layer 423 is formed.

Then, the transparent conductive layer 443 is formed on the current confinement layer 423, the lower electrode 441 is formed on the lower spacer layer 403, and the upper electrode 442 is formed on the insulating region 422 and the transparent conductive layer 443.

Then, the multilayer-film reflecting mirror 407 is formed on the transparent conductive layer 443. When the multilayer-film reflecting mirror 407 is formed, to situate the position of the transparent conductive layer 443 at a node of the standing wave 432, a $Ta_2O_5$ layer for phase adjustment is formed first, and then 8.5 periods of $SiO_2$ layers and $Ta_2O_5$ layers each having an optical thickness of $\lambda/4$ are alternately stacked. In the emission direction of light, the multilayer-film reflecting mirror 407 is terminated at the $SiO_2$ layer (low refractive-index layer) having the optical thickness of $\lambda/4$, so that a node of the standing wave 432 is at the emission surface 410.

Then, the metal layer 409 is formed in a region with a high light intensity of the fundamental mode 431 in a transverse direction, that is, in the first region 411.

In this way, it is possible to manufacture the surface emitting laser 4 according to the fourth embodiment.

In an embodiment of the present disclosure, $R_1/R_0$ is referred to as a reflection ratio where $R_0$ is a reflectivity when, based on an assumption that a first layer has a thickness of 0 nm, that is, air is present on a multilayer-film reflecting mirror, light generated in an active layer is incident on an interface between the multilayer-film reflecting mirror and the air from the multilayer-film reflecting mirror, and $R_1$ is a reflectivity when the light generated in the active layer is incident on an interface between the multilayer-film reflecting mirror and the first layer from the multilayer-film reflecting mirror. In other words, where $R_0$ is a reflectivity of the light generated in the active layer and incident from the multilayer-film reflecting mirror on an interface between the multilayer-film reflecting mirror and air assumed to be on the multilayer-film reflecting mirror, and $R_1$ is a reflectivity of the light generated in the active layer and incident from the multilayer-film reflecting mirror on an interface between the multilayer-film reflecting mirror and the first layer.

Also, $I_1/I_0$ is referred to as a transmission ratio where $I_0$ is a transmissivity when, based on an assumption that a first layer has a thickness of 0 nm, that is, air is present on a multilayer-film reflecting mirror, light generated in an active layer is transmitted from the multilayer-film reflecting mirror to the air, and $I_1$ is a transmissivity when the light generated in the active layer is transmitted from the multilayer-film reflecting mirror provided with a first metal layer on a first surface of the multilayer-film reflecting mirror to the air. In other words, $I_0$ is a transmissivity of the light generated in the active layer (104; 404; or 704), transmitted from the multilayer-film reflecting mirror to air assumed to be on the multiplayer-film reflecting mirror, and $I_1$ is a transmissivity of the light generated in the active layer (104; 404; or 704) transmitted from the multilayer-film reflecting mirror in which the first layer is formed to the air.

First Calculation Example

Figure 6A:
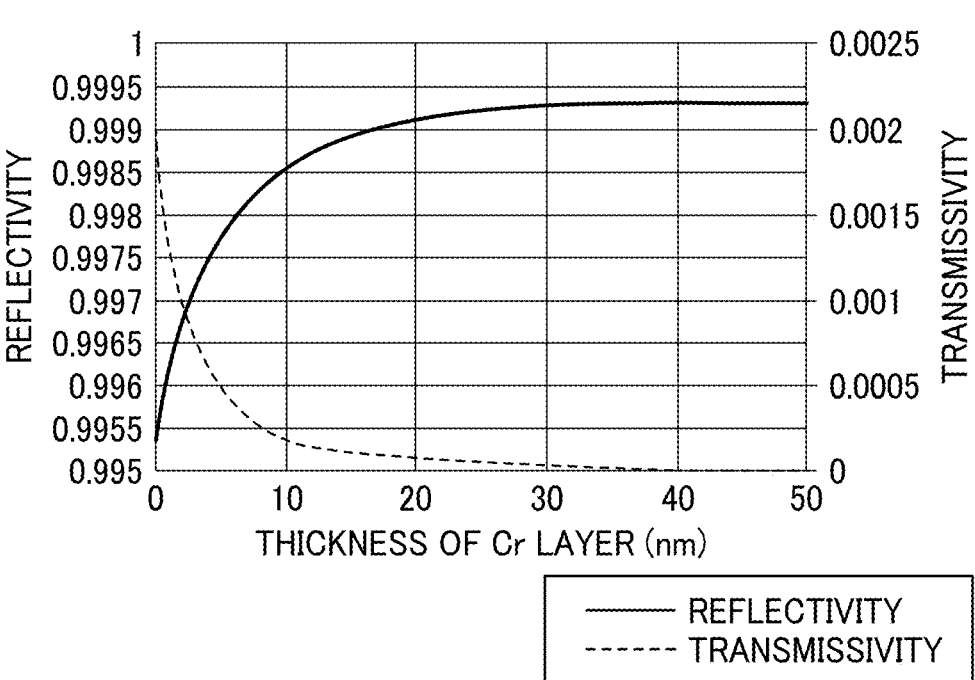
FIGS. 6A and 6B are graphs presenting results of a first calculation example according to the fourth embodiment.
Figure 6B:
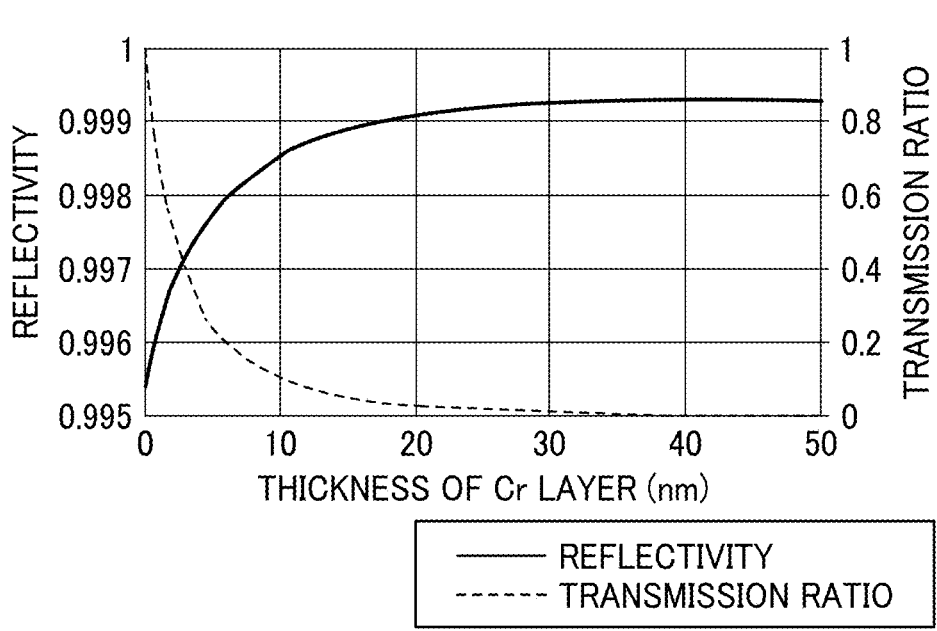

Next, a calculation example (first calculation example) performed according to the fourth embodiment is described. In the first calculation example, a stacked body including the lower reflecting mirror 402, the resonator 406, the multilayer-film reflecting mirror 407, and the metal layer 409 according to the fourth embodiment was used as a model. It is assumed that each layer was formed in a solid form. The multilayer-film reflecting mirror 407 is a multilayer-film reflecting mirror of a dielectric body with 8.5 periods, the emission surface 410 is terminated at the low refractive-index layer, and the emission surface 410 is situated at a node of the standing wave 432. The reflectivity of the upper reflecting mirror 408 and the transmissivity of the upper reflecting mirror 408 as viewed from the active layer 404 were calculated when the thickness of the Cr layer serving as the metal layer 409 was changed. FIGS. 6A and 6B present the results. FIG. 6A presents the relationship between the thickness of the Cr layer and the reflectivity and transmissivity of the upper reflecting mirror 408. FIG. 6B presents the relationship between the thickness of the Cr layer and the transmission ratio of the upper reflecting mirror 408, which is derived from FIG. 6A.

In this case, the calculation was performed based on an assumption that the refractive index of $Ta_2O_5$ was 2.21, the refractive index of $SiO_2$ was 1.46, and the complex refractive index of Cr was 2.27+3.10i. As presented in FIGS. 6A and 6B, the reflectivity increases as the thickness of the Cr layer increases, and the reflectivity becomes substantially constant as the thickness reaches a certain value. In contrast, the transmissivity and the transmission ratio decrease as the thickness of the Cr layer increases, and the transmissivity and the transmission ratio become substantially constant as the thickness reaches a certain value. In a case of the Cr layer having a thickness of 20 nm, the reflection ratio was 1.00368 and the transmission ratio was 0.0326. As described above, with the use of the Cr layer, the reflectivity of the upper reflecting mirror can be increased, and the optical output can be weakened through absorption by the Cr layer. Since the reflectivity increases as the Cr layer is thicker, a distribution of reflectivities can be provided even when a Cr layer thinner than that in the first region 411 is formed in the second region 412. For example, the thickness of the Cr layer in the first region 111 may be 20 nm to 40 nm with which the optical output can be sufficiently weakened, and the Cr layer having a thickness of about 1 nm to about 5 nm may be formed in the second region 112. In this case, a distribution of reflectivities is provided in a plane to operate the surface emitting laser 4 in a single mode, and the optical output can be weakened even in the second region 112. Such a surface emitting laser 4 can improve unimodal characteristics of a far-field image.

Second Calculation Example

Figure 7:
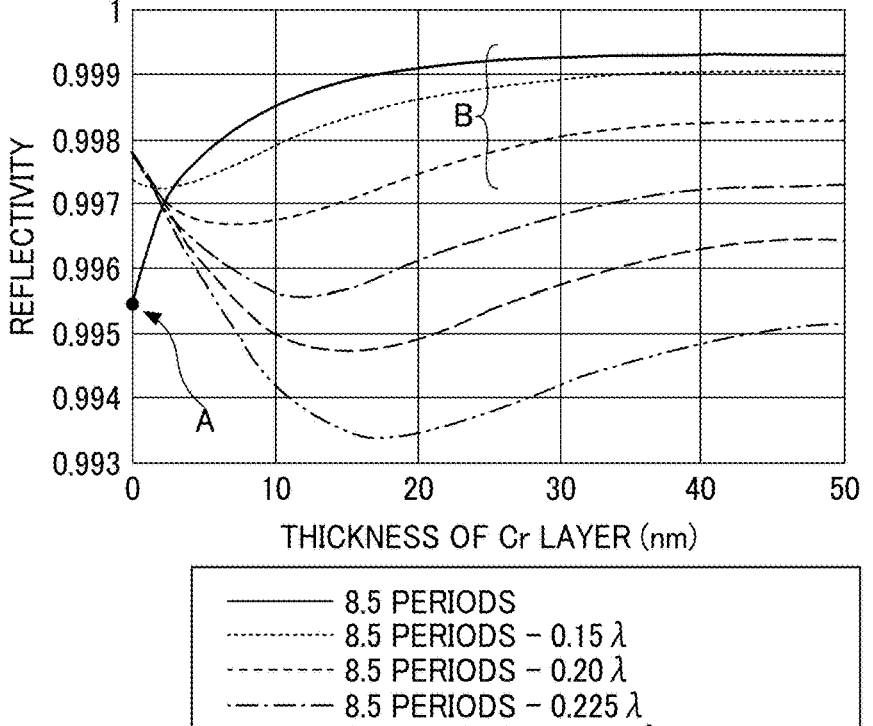
FIG. 7 is a graph presenting results of a second calculation example according to the fourth embodiment.

Next, another calculation example (second calculation example) performed according to the fourth embodiment is described. In the second calculation example, using a model similar to that in the first calculation example, the reflectivity of the upper reflecting mirror 408 as viewed from the active layer 404 was calculated when the optical thickness of the low refractive-index layer ($SiO_2$ layer) at the outermost layer of the multilayer-film reflecting mirror 407 was decreased from $\lambda/4$. FIG. 7 presents the results. The periods in the legend in FIG. 7 are the periods of the multilayer-film reflecting mirror 407.

The second region 112 according to the fourth embodiment corresponds to a point A in FIG. 7 where the thickness of the Cr layer is 0 nm with 8.5 periods. Even when the optical thickness of the outermost layer ($SiO_2$ layer) in the first region 111 is decreased from $\lambda/4$ (=0.25$\lambda$) to $\lambda/4$-0.20$\lambda$, the reflectivity is higher than that at the point A although the reflectivity slightly decreases (in a range of B in the drawing). It is most desirable that the outermost layer of the multilayer-film reflecting mirror 407 is a low refractive-index layer having an optical thickness of $\lambda/4$, in other words, a node of the standing wave is at the emission surface 410; however, FIG. 7 presents that both eye-safe use and single-mode operation are attained even when the optical thickness of the outermost layer of the multilayer-film reflecting mirror 407 in the first region 111 is decreased from $\lambda/4$ to about $\lambda/4$-0.20$\lambda$.

Third Calculation Example

Figure 8:
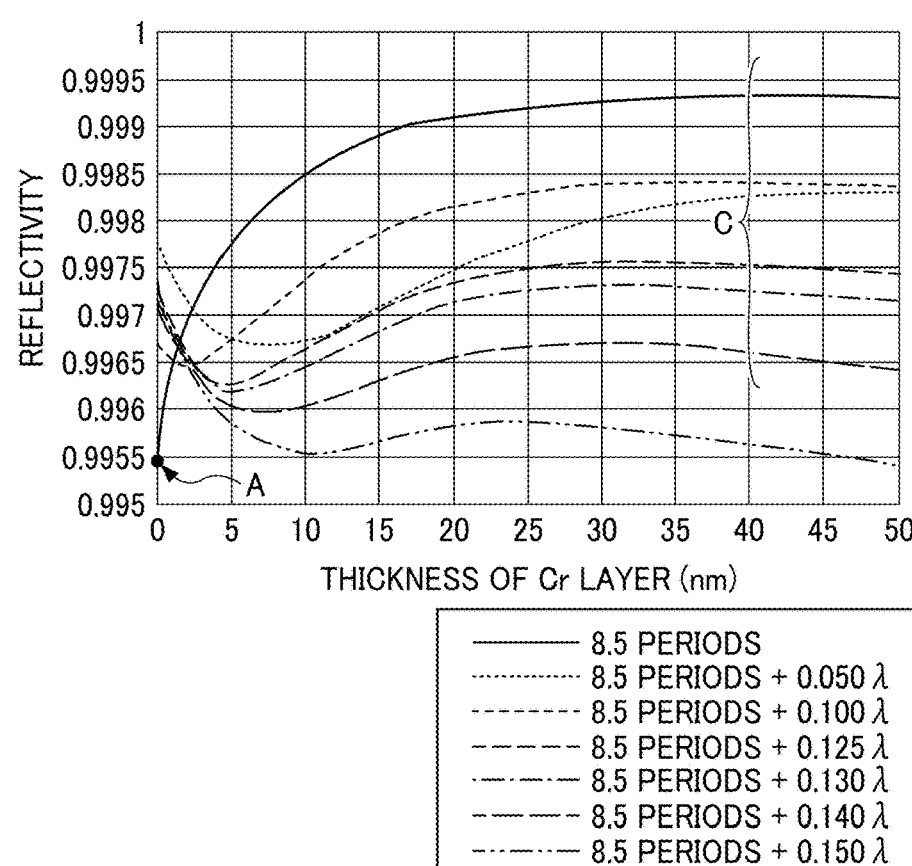
FIG. 8 is a graph presenting results of a third calculation example according to the fourth embodiment.

Next, another calculation example (third calculation example) performed according to the fourth embodiment is described. In the third calculation example, using a model similar to that in the first calculation example, the reflectivity of the upper reflecting mirror 408 as viewed from the active layer 404 was calculated when the optical thickness of the low refractive-index layer ($SiO_2$ layer) at the outermost layer of the multilayer-film reflecting mirror 407 was increased from $\lambda/4$. FIG. 8 presents the results. The periods in the legend in FIG. 8 are the periods of the multilayer-film reflecting mirror 407.

The second region 112 according to the fourth embodiment corresponds to a point A in FIG. 8 where the thickness of the Cr layer is 0 nm with 8.5 periods. Even when the optical thickness of the outermost layer ($SiO_2$ layer) in the first region 111 is increased from $\lambda/4$ (=0.25$\lambda$) to $\lambda/4$+0.140$\lambda$, the reflectivity is higher than that at the point A although the reflectivity slightly decreases (in a range of C in the drawing). It is most desirable that the outermost layer of the multilayer-film reflecting mirror 407 is a low refractive-index layer having an optical thickness of $\lambda/4$, in other words, a node of the standing wave is at the emission surface 410; however, FIG. 8 presents that both eye-safe use and single-mode operation are attained even when the optical thickness of the outermost layer of the multilayer-film reflecting mirror 407 in the first region 111 is increased from $\lambda/4$ to about $\lambda/4$+0.140$\lambda$.

First Modification of Fourth Embodiment

Figure 9:
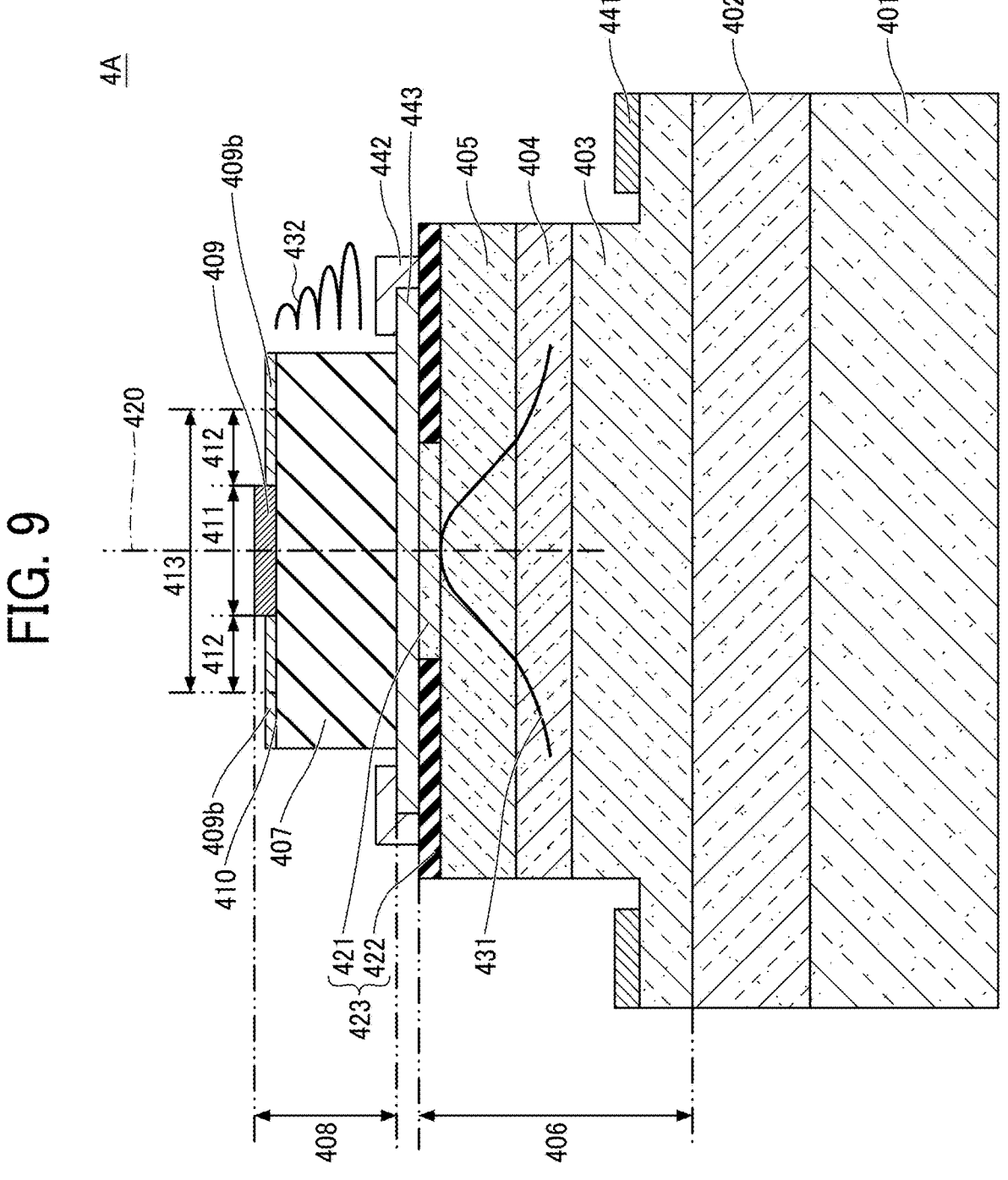
FIG. 9 is a cross-sectional schematic view illustrating a surface emitting laser according to a first modification of the fourth embodiment.

Next, a first modification of the fourth embodiment is described. The first modification differs from the fourth embodiment mainly for the configuration of a metal layer. FIG. 9 is a cross-sectional schematic view illustrating a surface emitting laser 4A according to the first modification of the fourth embodiment.

As illustrated in FIG. 9, in the surface emitting laser 4A according to the first modification of the fourth embodiment, the upper reflecting mirror 408 includes a metal layer 409b in addition to the multilayer-film reflecting mirror 407 and the metal layer 409.

The metal layer 409b is provided in the second region 412, and absorbs a portion of light generated in the active layer 404. The metal layer 409b is made of the same kind of metal as the metal layer 409, and is, for example, a Cr layer. The metal layer 409b is thinner than the metal layer 409.

The other configurations are similar to those in the fourth embodiment.

The first modification also attains effects similar to those of the fourth embodiment. As described in the first calculation example, since the optical output can be weakened even in the second region 112 while the surface emitting laser 4A operates in a single mode, the unimodal characteristics of a far-field image can be improved.

Second Modification of Fourth Embodiment

Figure 10:
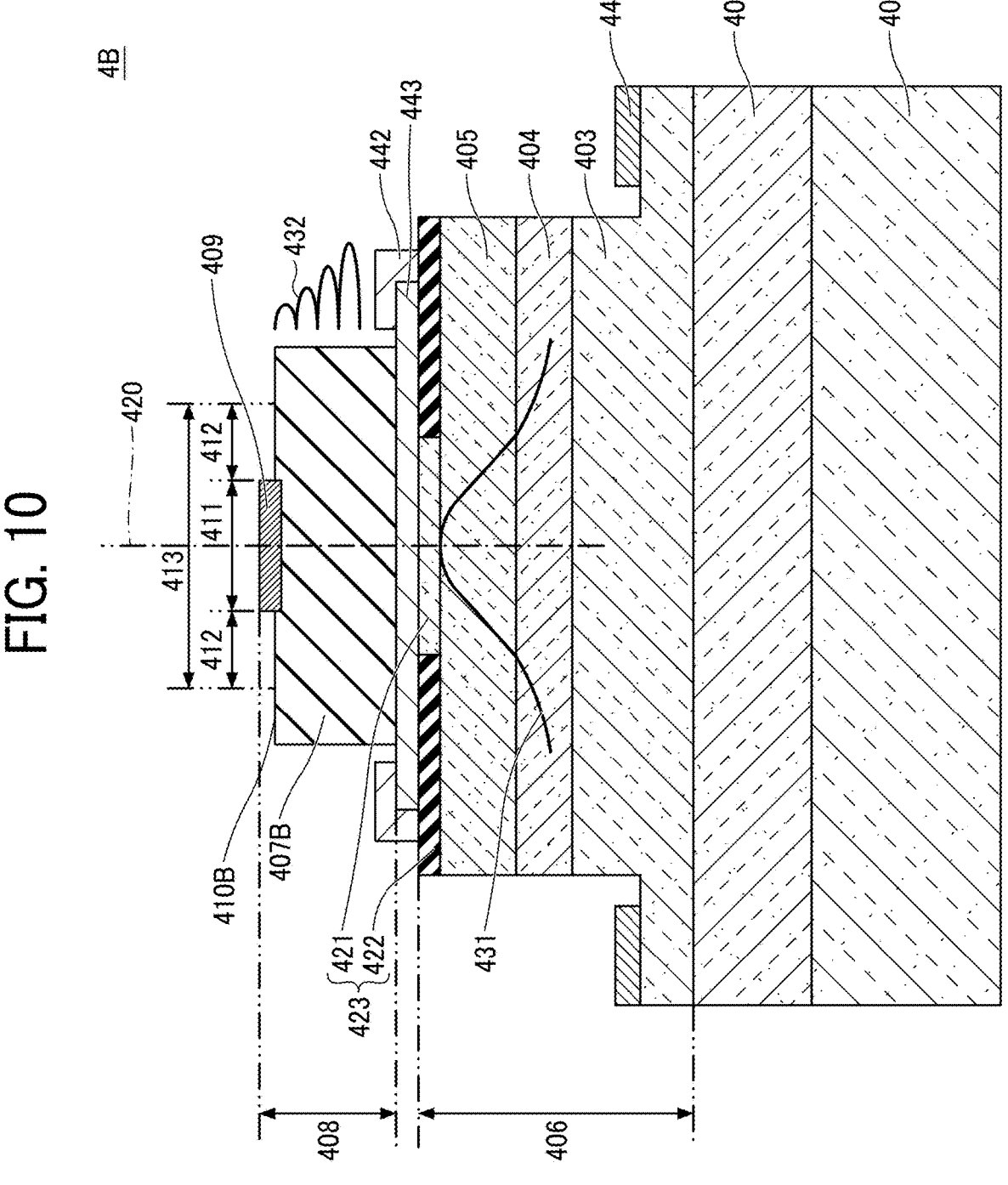
FIG. 10 is a cross-sectional schematic view illustrating a surface emitting laser according to a second modification of the fourth embodiment.

Next, a second modification of the fourth embodiment is described. The second modification differs from the fourth embodiment mainly for the configuration of a multilayer-film reflecting mirror. FIG. 10 is a cross-sectional schematic view illustrating a surface emitting laser 4B according to the second modification of the fourth embodiment.

As illustrated in FIG. 10, in the surface emitting laser 4B according to the second modification of the fourth embodiment, the upper reflecting mirror 408 includes a multilayer-film reflecting mirror 407B instead of the multilayer-film reflecting mirror 407. In a portion of the multilayer-film reflecting mirror 407B overlapping the first region 411 in a plan view, the thickness of a low refractive-index layer ($SiO_2$ layer) at the outermost layer is smaller than the thickness of the low refractive-index layer ($SiO_2$ layer) of the multilayer-film reflecting mirror 407. For example, the low refractive-index layer ($SiO_2$ layer) at the outermost layer of the multilayer-film reflecting mirror 407 has an optical thickness of $\lambda/4$, whereas the low refractive-index layer ($SiO_2$ layer) of the multilayer-film reflecting mirror 407B has an optical thickness of $\lambda/4$-$0.20\lambda$ or more and less than $\lambda/4$. Thus, in the first region 411, a node of a standing wave 432 is deviated from an emission surface 410B of the multilayer-film reflecting mirror 407.

The other configurations are similar to those in the fourth embodiment.

As described in the second calculation example, even with the second modification, both eye-safe use and single-mode operation can be attained.

Third Modification of Fourth Embodiment

Figure 11:
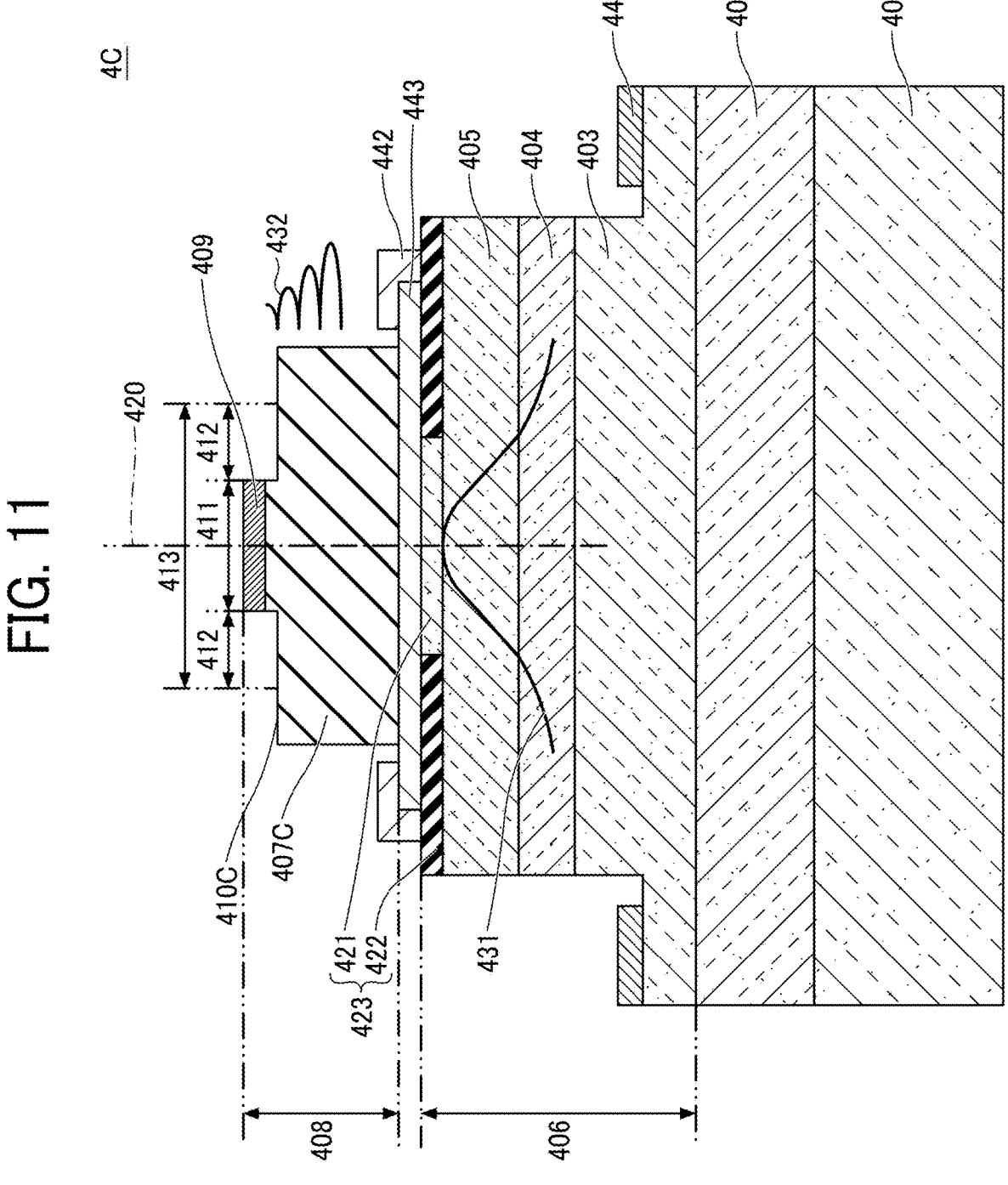
FIG. 11 is a cross-sectional schematic view illustrating a surface emitting laser according to a third modification of the fourth embodiment.

Next, a third modification of the fourth embodiment is described. The third modification differs from the fourth embodiment mainly for the configuration of a multilayer-film reflecting mirror. FIG. 11 is a cross-sectional schematic view illustrating a surface emitting laser 4C according to the third modification of the fourth embodiment.

As illustrated in FIG. 11, in the surface emitting laser 4C according to the third modification of the fourth embodiment, the upper reflecting mirror 408 includes a multilayer-film reflecting mirror 407C instead of the multilayer-film reflecting mirror 407. In a portion of the multilayer-film reflecting mirror 407C overlapping the first region 411 in a plan view, the thickness of a low refractive-index layer ($SiO_2$ layer) at the outermost layer is larger than the thickness of the low refractive-index layer ($SiO_2$ layer) of the multilayer-film reflecting mirror 407. For example, the low refractive-index layer ($SiO_2$ layer) at the outermost layer of the multilayer-film reflecting mirror 407 has an optical thickness of $\lambda/4$, whereas the low refractive-index layer ($SiO_2$ layer) of the multilayer-film reflecting mirror 407B has an optical thickness of more than $\lambda/4$ and $\lambda/4$+$0.140\lambda$ or less. Thus, in the first region 411, a node of a standing wave 432 is deviated from an emission surface 410C of the multilayer-film reflecting mirror 407.

The other configurations are similar to those in the fourth embodiment.

As described in the third calculation example, even with the third modification, both eye-safe use and single-mode operation can be attained.

Fifth Embodiment

Figure 12:
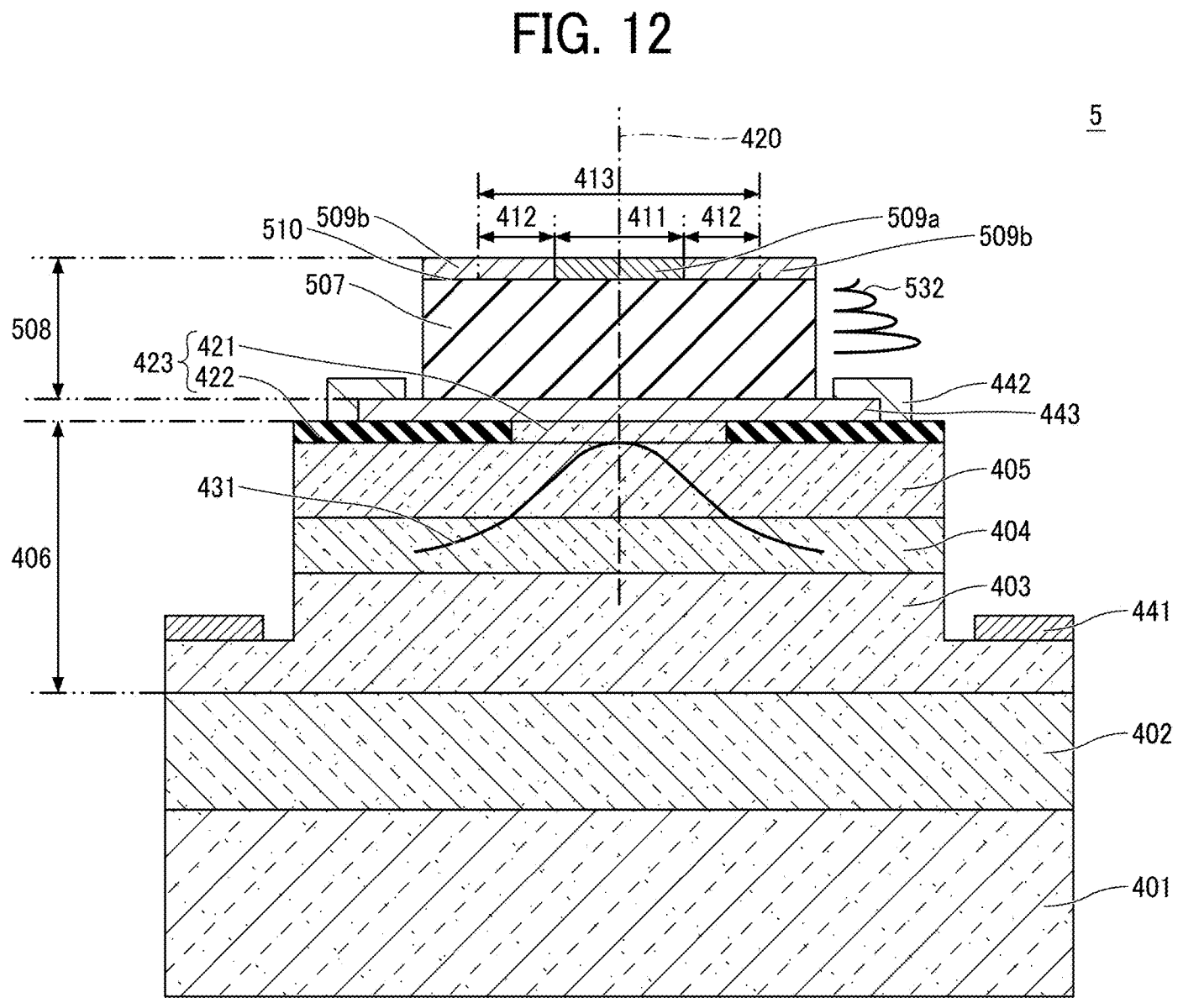

A fifth embodiment is described next. The fifth embodiment differs from the fourth embodiment mainly for the configuration of an upper reflecting mirror. FIG. 12 is a cross-sectional schematic view illustrating a surface emitting laser 5 according to the fifth embodiment. The fifth embodiment corresponds to a specific example of the second embodiment.

The surface emitting laser 5 according to the fifth embodiment is a surface emitting laser that uses GaN and has a wavelength $\lambda$ of 515 nm. As illustrated in FIG. 12, the surface emitting laser 5 according to the fifth embodiment includes an upper reflecting mirror 508 (first reflecting mirror) instead of the upper reflecting mirror 408. The upper reflecting mirror 508 includes a multilayer-film reflecting mirror 507, a metal layer 509a, and a metal layer 509b. The multilayer-film reflecting mirror 507 is provided on the transparent conductive layer 443. The metal layers 509a and 509b are provided on the multilayer-film reflecting mirror 507. The metal layers 509a and 509b are provided on an emission surface 510 of the multilayer-film reflecting mirror 507. The emission surface 510 is located on a side opposite to the resonator 406.

The lower reflecting mirror 402 is, for example, a multilayer-film reflecting mirror including a semiconductor including 50 periods of high refractive-index layers and low refractive-index layers. For example, the high refractive-index layers each are a GaN layer, and the low refractive-index layers each are an aluminum indium nitride (AlInN) layer. The optical thickness of one period of the high refractive-index layer and the low refractive-index layer is $\lambda/2$.

The multilayer-film reflecting mirror 507 has a configuration similar to that of the multilayer-film reflecting mirror 207. That is, the multilayer-film reflecting mirror 507 includes a low refractive-index layer and a high refractive-index layer, and the low refractive-index layer and the high refractive-index layer are alternately stacked. The low refractive-index layer has a first refractive index. The high refractive-index layer has a second refractive index higher than the first refractive index. The multilayer-film reflecting mirror 507 is, for example, a multilayer-film reflecting mirror including a dielectric body including 8 periods of high refractive-index layers and low refractive-index layers. For example, the high refractive-index layers each are a $Ta_2O_5$ layer, and the low refractive-index layers each are a $SiO_2$ layer. The optical thickness of one period of the high refractive-index layer and the low refractive-index layer is $\lambda/2$. For example, the multilayer-film reflecting mirror 507 includes 8 $Ta_2O_5$ layers and 8 $SiO_2$ layers.

FIG. 12 schematically illustrates the positions of an antinode and a node of a standing wave 532. In the fifth embodiment, the resonator 406 has a thickness with which the standing wave 532 with a wavelength $\lambda$ of 515 nm is generated. To obtain a high gain, the active layer 404 is situated at an antinode of the standing wave 532 having a high light intensity. To suppress light absorption, the transparent conductive layer 443 is situated at a node of the standing wave 532. An antinode of the standing wave 532 is at the emission surface 510 of the multilayer-film reflecting mirror 507. For example, a high refractive-index layer having an optical thickness of $\lambda/4$ defines the emission surface 510. That is, the multilayer-film reflecting mirror 507 is terminated at the high refractive-index layer ($Ta_2O_5$ layer) in an emission direction of light.

The emission surface 510 of the multilayer-film reflecting mirror 507 has an emission region 413, and the emission region 413 includes a first region 411 and a second region 412, similarly to the fourth embodiment. The metal layer 509a is provided in the first region 411, and absorbs a portion of light generated in the active layer 404. The metal layer 509b is provided in the second region 412, and absorbs a portion of the light generated in the active layer 404. The refractive index of the metal layer 509a is lower than the refractive index of the metal layer 509b. For example, the metal layer 509a is an Al layer, and the metal layer 509b is a Cr layer. The thickness of the metal layers 509a and 509b is, for example, 30 nm. The metal layer 509b may be provided also outside the emission region 413 in a plan view.

The other configurations are similar to those in the fourth embodiment.

In the fifth embodiment, the reflectivity of a portion of the upper reflecting mirror 508 overlapping the first region 411 in a plan view as viewed from the active layer 404 is higher than the reflectivity of a portion of the upper reflecting mirror 508 overlapping the second region 412 in the plan view as viewed from the active layer 404. For example, the reflectivity of the portion of the upper reflecting mirror 508 overlapping the first region 411 in the plan view as viewed from the active layer 404 is 0.9980, and the reflectivity of the portion of the upper reflecting mirror 508 overlapping the second region 412 in the plan view as viewed from the active layer 404 is 0.9926. Thus, similarly to the fourth embodiment, the oscillation threshold value of a high-order mode is higher than the oscillation threshold value of a single mode in an in-plane transverse direction, and the surface emitting laser 5 operates in the single mode.

Also, since the metal layers 509a and 509b absorb the portions of the light, the optical output of the surface emitting laser 5 can be suppressed. For example, the optical output of the surface emitting laser 5 can be about sub-microwatts to about several tens of microwatts, which is suitable for eye-safe use. That is, even with the fifth embodiment, both eye-safe use and single-mode operation can be attained.

A method for manufacturing the surface emitting laser 5 according to the fifth embodiment is described next.

First, processing up to formation of the lower electrode 441 and the upper electrode 442 is performed in a manner similar to that in the fourth embodiment. Then, the multilayer-film reflecting mirror 507 is formed on the transparent conductive layer 443. When the multilayer-film reflecting mirror 507 is formed, to situate the position of the transparent conductive layer 443 at a node of the standing wave 532, a $Ta_2O_5$ layer for phase adjustment is formed first, and then 8 periods of $SiO_2$ layers and $Ta_2O_5$ layers each having an optical thickness of λ/4 are alternately stacked. In the emission direction of light, the multilayer-film reflecting mirror 507 is terminated at the $Ta_2O_5$ layer (high refractive-index layer) having the optical thickness of λ/4, so that an antinode of the standing wave 532 is at the emission surface 510.

Then, the metal layer 509a is formed in a region with a high light intensity of the fundamental mode 431 in the transverse direction, that is, in the first region 411. Then, the metal layer 509b is formed around the metal layer 509a. When the metal layer 509b is formed, for example, a resist is formed by exposure to light from the back surface of the substrate 401 while the metal layer 509a is used as a photomask, thereby forming the metal layer 509b through self-alignment.

In this way, it is possible to manufacture the surface emitting laser 5 according to the fifth embodiment.

An Al layer may be used as the metal layer 509a, a Cr layer may be used as the metal layer 509b, and the metal layer 509b may be thicker than the metal layer 509a. In this case, the metal layer 509b may be formed before the metal layer 509a, and the metal layer 509a may be formed over the first region 411 and the second region 412. When the metal layer 509b is formed thick, light transmitted through the multilayer-film reflecting mirror 507 is absorbed by the metal layer 509b, and is unlikely to be reflected to the multilayer-film reflecting mirror 507. Thus, even when the metal layer 509a is formed on the metal layer 509b, the reflectivity is not affected.

Fourth Calculation Example

Next, a calculation example (fourth calculation example) performed according to the fifth embodiment is described. In the fourth calculation example, a stacked body including the lower reflecting mirror 402, the resonator 406, the multilayer-film reflecting mirror 507, and the metal layer 509a or 509b according to the fifth embodiment was used as a model. It is assumed that each layer was formed in a solid form. The multilayer-film reflecting mirror 507 is a multilayer-film reflecting mirror of a dielectric body with 8 periods, the emission surface 510 is terminated at the high refractive-index layer, and the emission surface 510 is situated at an antinode of the standing wave 532. The reflectivity of the upper reflecting mirror 508 and the transmissivity of the upper reflecting mirror 508 as viewed from the active layer 404 were calculated when the thickness of the Al layer or the Cr layer serving as the metal layer 509a or 509b was changed.

Figure 13A:
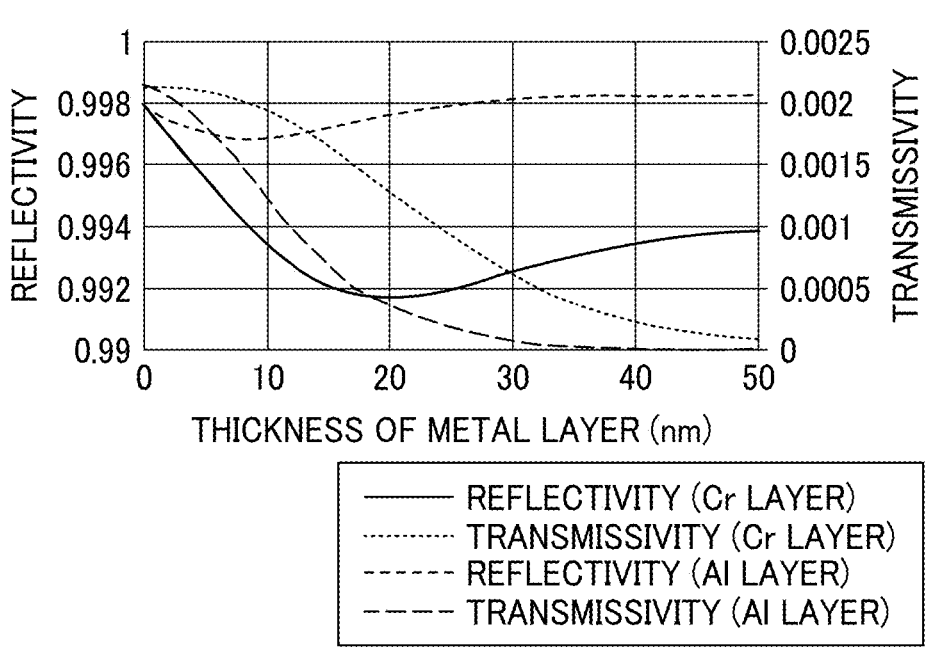
FIGS. 13A and 13B are graphs presenting results of a fourth calculation example according to the fifth embodiment.
Figure 13B:
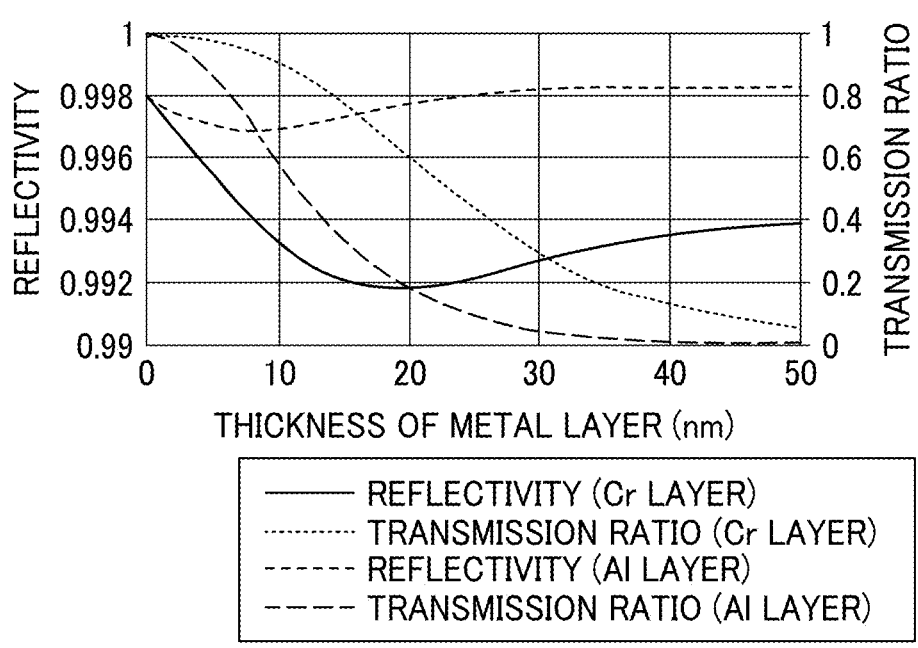

FIGS. 13A and 13B present the results. FIG. 13A presents the relationship between the thickness of the metal layer (Al layer or Cr layer) and the reflectivity and transmissivity of the upper reflecting mirror 508. FIG. 13B presents the relationship between the thickness of the metal layer and the transmission ratio of the upper reflecting mirror 508, which is derived from FIG. 13A.

In this case, the calculation was performed based on an assumption that the refractive index of $Ta_2O_5$ was 2.20, the refractive index of $SiO_2$ was 1.45, the complex refractive index of Cr was 2.91+3.33i, and the complex refractive index of Al was 0.826+6.28i. As presented in FIGS. 13A and 13B, as the thickness of the metal layer increases, the reflectivity temporarily decreases, and then the reflectivity increases and becomes substantially constant. The amount by which the refractive index decreases and the value when the refractive index reaches a constant value vary depending on the kind of metal. Specifically, Al having a low refractive index has a reflectivity higher than that of Cr. In a multilayer-film reflecting mirror of a normal dielectric body or semiconductor, when one low refractive-index layer is formed on a high refractive-index layer having an optical thickness of λ/4, the reflectivity decreases. In contrast, when a layer of a metal having a low refractive index, such as Al, is formed, the reflectivity is almost not decreased, and when a layer having a sufficient thickness is formed, the reflectivity is increased. In a case of an Al layer having a thickness of 30 nm, the reflection ratio was 1.00019 and the transmission ratio was 0.0374.

Focusing on the Cr layer, the reflectivity in a range of the thickness of the Cr layer from 10 nm to 30 nm is generally smaller than the reflectivity in a range of the thickness of the Cr layer of 1 nm or more and less than 10 nm or the reflectivity in a range of the thickness of the Cr layer of 40 nm or more. Thus, when Cr layers having different thicknesses are used as the metal layers 509a and 509b, the reflectivity of the portion of the upper reflecting mirror 508 overlapping the first region 411 in the plan view as viewed from the active layer 404 can be higher than the reflectivity of the portion of the upper reflecting mirror 508 overlapping the second region 412 in the plan view as viewed from the active layer 404.

Modification of Fifth Embodiment

Figure 14:
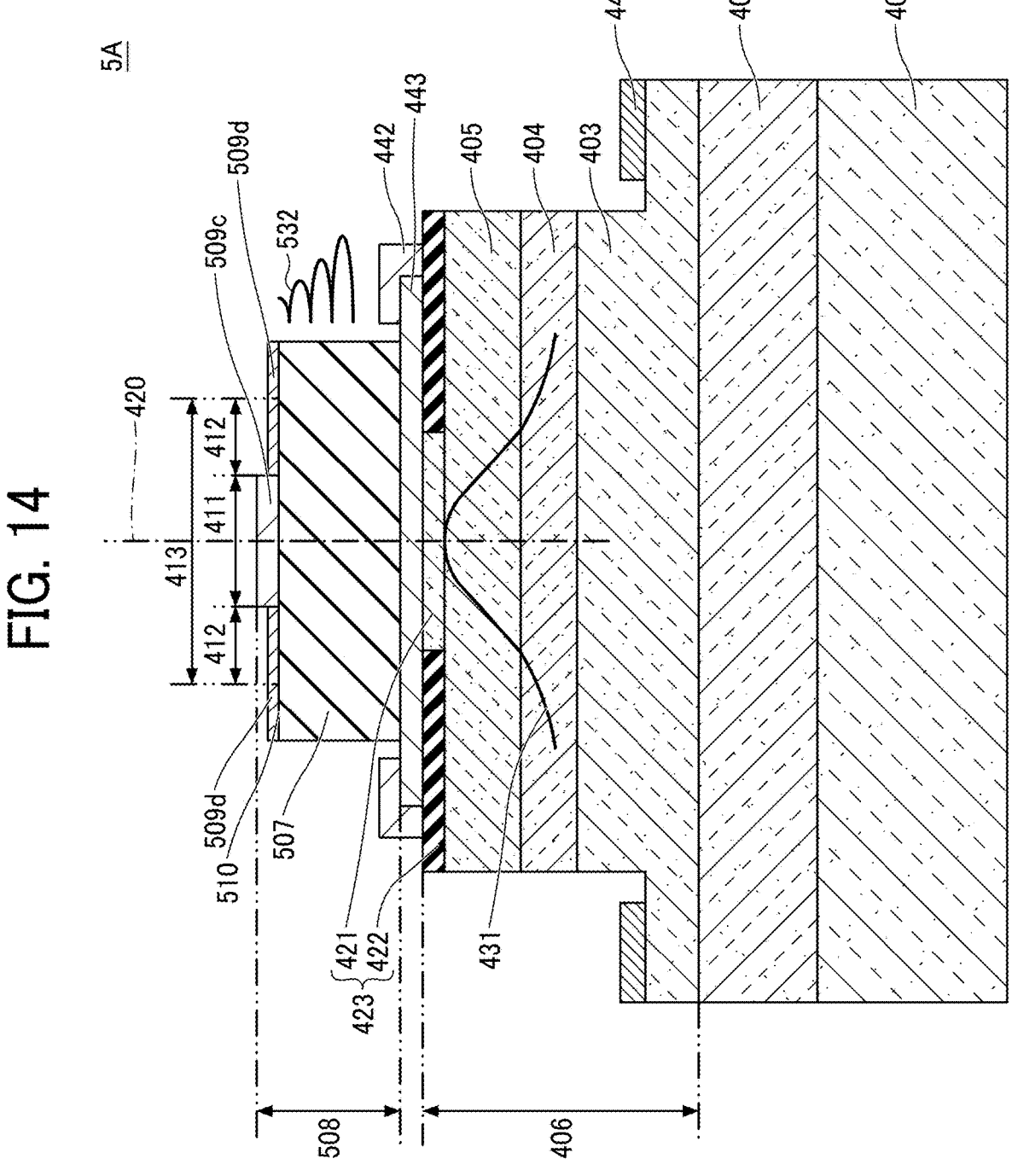
FIG. 14 is a cross-sectional schematic view illustrating a surface emitting laser according to a modification of the fifth embodiment.

Next, a modification of the fifth embodiment is described. The modification differs from the fifth embodiment mainly for the configuration of a metal layer. FIG. 14 is a cross-sectional schematic view illustrating a surface emitting laser 5A according to the modification of the fifth embodiment.

As illustrated in FIG. 14, in the surface emitting laser 5A according to the modification of the fifth embodiment, the upper reflecting mirror 508 includes a metal layer 509*c* instead of the metal layer 509*a*, and includes a metal layer 509*d* instead of the metal layer 509*b*. The metal layers 509*c* and 509*d* are both Cr layers. The metal layer 509*c* has a thickness of 40 nm or more, and the metal layer 509*d* has a thickness of about 10 nm to about nm.

The other configurations are similar to those in the fifth embodiment.

As described in the fourth calculation example, even in the modification of the fifth embodiment, the reflectivity of a portion of the upper reflecting mirror 508 overlapping the first region 411 in a plan view as viewed from the active layer 404 is higher than the reflectivity of a portion of the upper reflecting mirror 508 overlapping the second region 412 in the plan view as viewed from the active layer 404. That is, similarly to the fifth embodiment, both eye-safe use and single-mode operation can be attained.

The thickness of the metal layer 509*c* may be 1 nm or more and less than 10 nm. Although it is difficult to obtain a large difference in reflectivity as large as the Cr layer, Al layers having different thicknesses may be used as the metal layers 509*c* and 509*d*.

Sixth Embodiment

Figure 15:
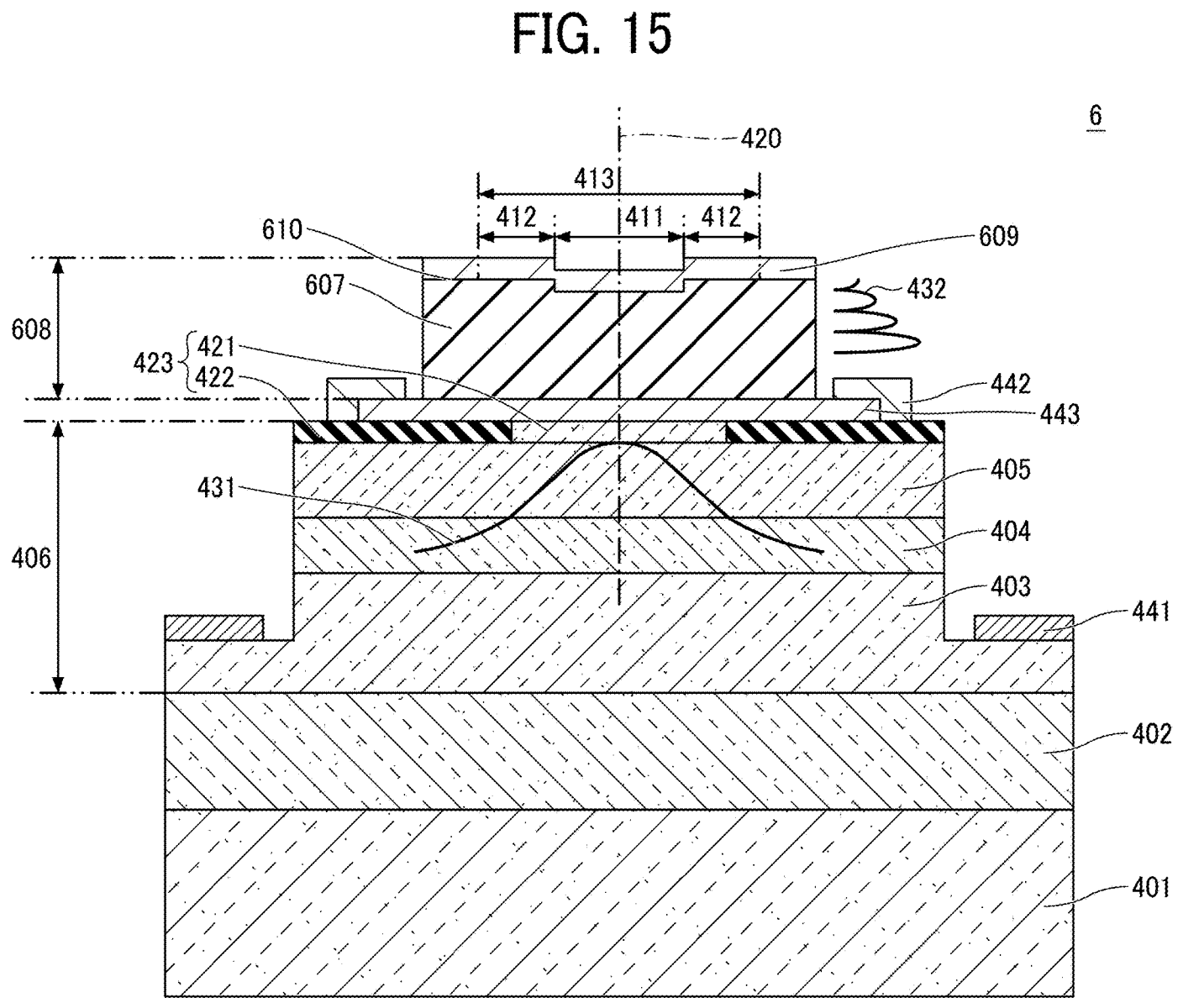

A sixth embodiment is described next. The sixth embodiment differs from the fourth embodiment and so forth mainly for the configuration of an upper reflecting mirror. FIG. 15 is a cross-sectional schematic view illustrating a surface emitting laser 6 according to the sixth embodiment. The sixth embodiment corresponds to a specific example of the third embodiment.

The surface emitting laser 6 according to the sixth embodiment is a surface emitting laser that uses GaN and has a wavelength $\lambda$ of 445 nm. As illustrated in FIG. 15, the surface emitting laser 6 according to the sixth embodiment includes an upper reflecting mirror 608 (first reflecting mirror) instead of the upper reflecting mirror 408. The upper reflecting mirror 608 includes a multilayer-film reflecting mirror 607 and a metal layer 609. The multilayer-film reflecting mirror 607 is provided on the transparent conductive layer 443. The metal layer 609 is provided on the multilayer-film reflecting mirror 607. The metal layer 609 is provided on an emission surface 610 of the multilayer-film reflecting mirror 607. The emission surface 610 is located on a side opposite to the resonator 406.

FIG. 15 schematically illustrates the positions of an antinode and a node of a standing wave 432. The emission surface 610 of the multilayer-film reflecting mirror 607 has an emission region 413, and the emission region 413 includes a first region 411 and a second region 412, similarly to the fourth embodiment. In the sixth embodiment, a node of the standing wave 432 is in the first region 411, and an antinode of the standing wave 432 is in the second region 412 at the emission surface 610 of the multilayer-film reflecting mirror 607. For example, a low refractive-index layer having an optical thickness of $\lambda/4$ defines the emission surface 610 in the first region 411, and a high refractive-index layer having an optical thickness of $\lambda/4$ defines the emission surface 610 in the second region 412. That is, in an emission direction of light, the multilayer-film reflecting mirror 607 is terminated at the low refractive-index layer in the first region 411, and is terminated at the high refractive-index layer in the second region 412. For example, the high refractive-index layer is a $Ta_2O_5$ layer, and the low refractive-index layer is a $SiO_2$ layer. The optical thickness of one period of the high refractive-index layer and the low refractive-index layer is $\lambda/2$. For example, the multilayer-film reflecting mirror 607 includes 11 high refractive-index layers and 10 low refractive-index layers in a portion overlapping the first region 411, and includes 11 high refractive-index layers and 11 low refractive-index layers in a portion overlapping the second region 412.

That is, the multilayer-film reflecting mirror 607 includes a dielectric body including 10.5 periods of high refractive-index layers and low refractive-index layers in the portion overlapping the first region 411, and includes a dielectric body including 11 periods of high refractive-index layers and low refractive-index layers in the portion overlapping the second region 412.

The metal layer 609 is provided in the first region 411 and the second region 412, and absorbs a portion of light generated in the active layer 404. For example, the metal layer 609 is a Cr layer, and the metal layer 609 has a thickness of 20 nm. The metal layer 609 may be provided also outside the emission region 413 in a plan view.

The other configurations are similar to those in the fourth embodiment.

In the sixth embodiment, the reflectivity of a portion of the upper reflecting mirror 608 overlapping the first region 411 in a plan view as viewed from the active layer 404 is higher than the reflectivity of a portion of the upper reflecting mirror 608 overlapping the second region 412 in the plan view as viewed from the active layer 404. For example, the reflectivity of the portion of the upper reflecting mirror 608 overlapping the first region 411 in the plan view as viewed from the active layer 404 is 0.9999, and the reflectivity of the portion of the upper reflecting mirror 608 overlapping the second region 412 in the plan view as viewed from the active layer 404 is 0.9994. Thus, the oscillation threshold value of a high-order mode is higher than the oscillation threshold value of a single mode in an in-plane transverse direction, and the surface emitting laser 6 operates in the single mode. Also, since the metal layer 609 absorbs the portion of the light, the optical output of the surface emitting laser 6 can be suppressed. For example, the optical output of the surface emitting laser 6 can be about sub-microwatts to about several tens of microwatts, which is suitable for eye-safe use. That is, according to the sixth embodiment, both eye-safe use and single-mode operation can be attained.

A method for manufacturing the surface emitting laser 6 according to the sixth embodiment is described next.

First, processing up to formation of the lower electrode 441 and the upper electrode 442 is performed in a manner similar to that in the fourth embodiment. Then, the multilayer-film reflecting mirror 607 is formed on the transparent conductive layer 443. When the multilayer-film reflecting mirror 607 is formed, to situate the position of the transparent conductive layer 443 at a node of the standing wave 432, a $Ta_2O_5$ layer for phase adjustment is formed first, and then 10.5 periods of $SiO_2$ layers and $Ta_2O_5$ layers each having an optical thickness of 14 are alternately stacked. Further, a resist is formed in a region to be the first region 411, and a $Ta_2O_5$ layer having an optical thickness of $\lambda/4$ is formed on the $SiO_2$ layer at the outermost layer using the resist as a mask. Thus, the multilayer-film reflecting mirror 607 is formed.

Then, the metal layer 609 is formed on the multilayer-film reflecting mirror 607.

In this way, it is possible to manufacture the surface emitting laser 6 according to the sixth embodiment.

Fifth Calculation Example

Next, a calculation example (fifth calculation example) performed according to the sixth embodiment is described.

Figure 16:
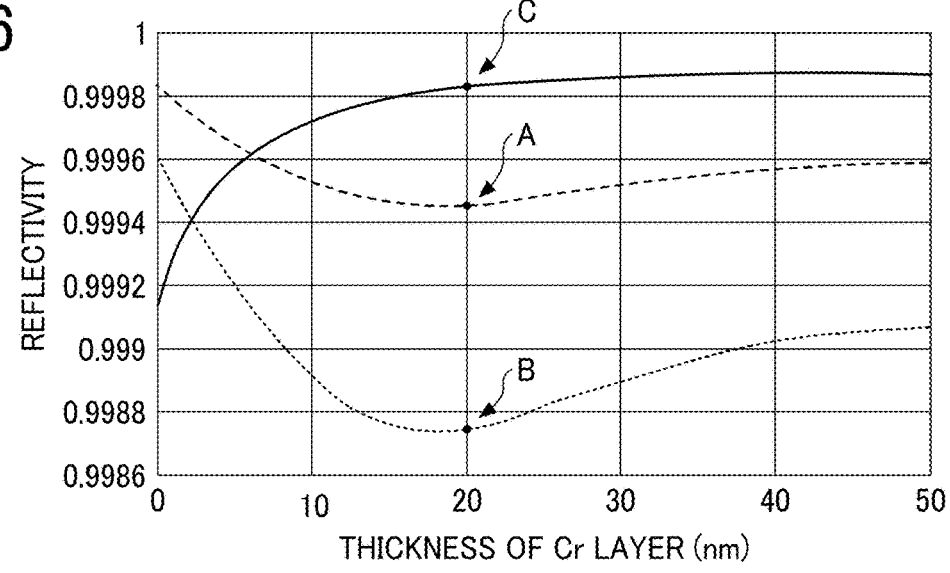
FIG. 16 is a graph presenting results of a fifth calculation example according to the sixth embodiment.

In the fifth calculation example, a stacked body including the lower reflecting mirror 402, the resonator 406, the multilayer-film reflecting mirror 607, and the metal layer 609 according to the sixth embodiment was used as a model. It is assumed that each layer was formed in a solid form. The multilayer-film reflecting mirror 607 is a multilayer-film reflecting mirror having 10.5 periods in the portion overlapping the first region 411 and 11 periods in the portion overlapping the second region 412. The reflectivity of the upper reflecting mirror 608 as viewed from the active layer 404 was calculated when the thickness of the Cr layer serving as the metal layer 609 was changed. The calculation was also performed for a model of the multilayer-film reflecting mirror 607 with 10.5 periods in the portion overlapping the first region 411, and 10.5 periods or 10 periods in the portion overlapping the second region 412. FIG. 16 presents the results.

When the thickness of the Cr layer was 20 nm, in the portion overlapping the second region 412, the reflectivity was lower in the model with 11 periods (point A in FIG. 16, corresponding to the sixth embodiment), and also in the model with 10 periods (point B in FIG. 16) than the reflectivity in the model with 10.5 periods (point C in FIG. 16). That is, in a model in which the number of high refractive-index layers in the portion overlapping the second region 412 is increased by one layer, and in a model in which the number of high refractive-index layers in the portion overlapping the second region 412 is decreased by one layer compared to the number of high refractive-index layers in the portion overlapping the first region 411, the reflectivity in the portion overlapping the second region 412 can be decreased.

Modification of Sixth Embodiment

Figure 17:
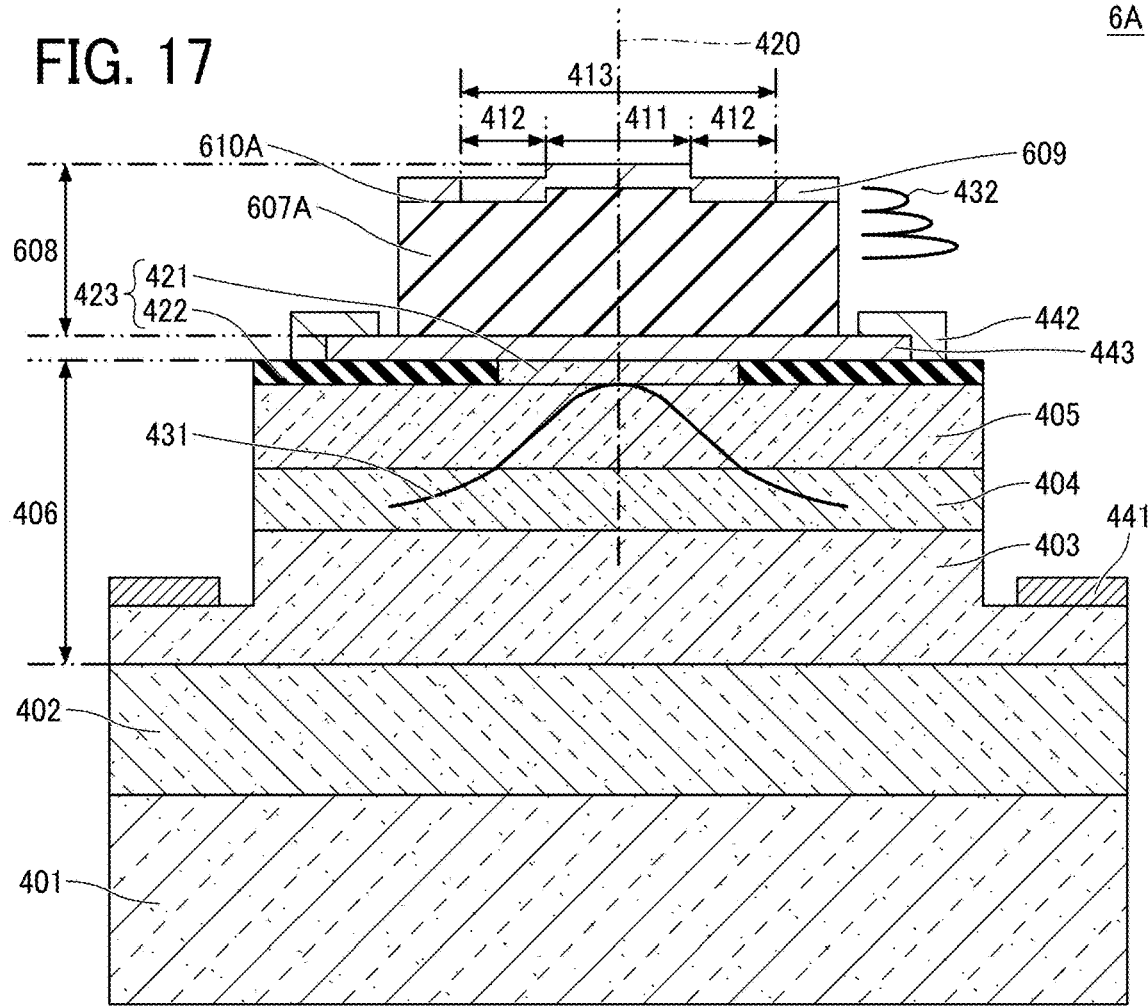
FIG. 17 is a cross-sectional schematic view illustrating a surface emitting laser according to a modification of the sixth embodiment.

Next, a modification of the sixth embodiment will be described. The modification differs from the sixth embodiment mainly for the configuration of a multilayer-film reflecting mirror. FIG. 17 is a cross-sectional schematic view illustrating a surface emitting laser 6A according to the modification of the sixth embodiment.

As illustrated in FIG. 17, in the surface emitting laser 6A according to the modification of the sixth embodiment, the upper reflecting mirror 608 includes a multilayer-film reflecting mirror 607A instead of the multilayer-film reflecting mirror 607. Similarly to the sixth embodiment, a node of a standing wave 432 is in the first region 411, and an antinode of the standing wave 432 is in the second region 412 at an emission surface 610A of the multilayer-film reflecting mirror 607A. For example, the multilayer-film reflecting mirror 607A includes 11 high refractive-index layers and 10 low refractive-index layers in a portion overlapping the first region 411, and includes 10 high refractive-index layers and 10 low refractive-index layers in a portion overlapping the second region 412. That is, the multilayer-film reflecting mirror 607 includes a dielectric body including 10.5 periods of high refractive-index layers and low refractive-index layers in the portion overlapping the first region 411, and includes a dielectric body including 10 periods of high refractive-index layers and low refractive-index layers in the portion overlapping the second region 412.

The other configurations are similar to those in the sixth embodiment.

As described in the fifth calculation example, even in the modification of the sixth embodiment, the reflectivity of a portion of the upper reflecting mirror 608 overlapping the first region 411 in a plan view as viewed from the active layer 404 is higher than the reflectivity of a portion of the upper reflecting mirror 608 overlapping the second region 412 in the plan view as viewed from the active layer 404. That is, similarly to the sixth embodiment, both eye-safe use and single-mode operation can be attained.

Seventh Embodiment

Figure 18:
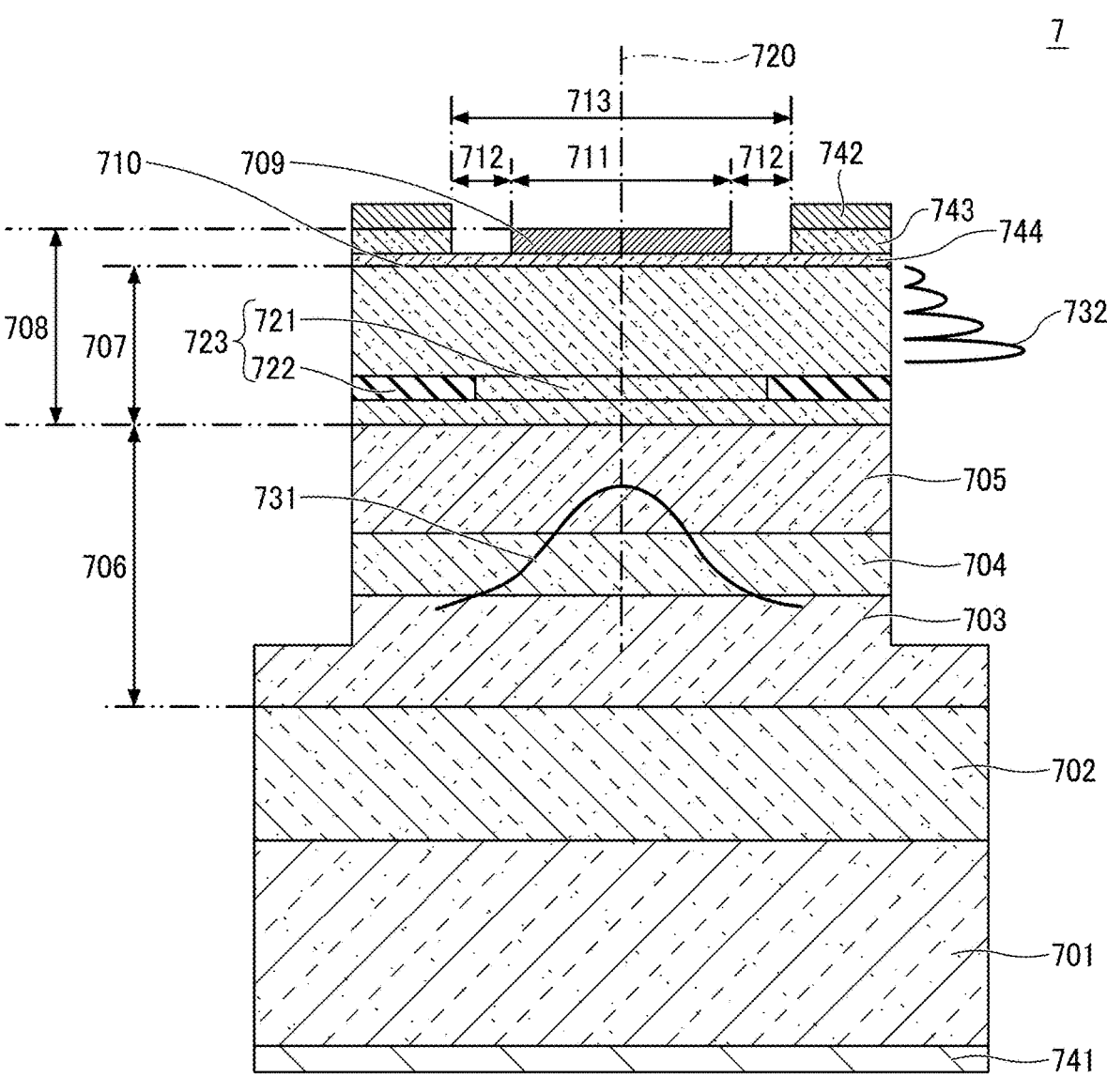
FIG. 18 is a cross-sectional schematic view illustrating a surface emitting laser according to a seventh embodiment.

A seventh embodiment is described next. The seventh embodiment relates to a surface emitting laser. FIG. 18 is a cross-sectional schematic view illustrating a surface emitting laser 7 according to the seventh embodiment. The seventh embodiment corresponds to another specific example of the first embodiment.

The surface emitting laser 7 according to the seventh embodiment is a surface emitting laser that uses gallium arsenide (GaAs) and has a wavelength $\lambda$ of 650 nm. As illustrated in FIG. 18, the surface emitting laser 7 includes a substrate 701, a lower reflecting mirror 702 (second reflecting mirror), a lower spacer layer 703, an active layer 704, an upper spacer layer 705, and an upper reflecting mirror 708 (first reflecting mirror). The upper reflecting mirror 708 includes a multilayer-film reflecting mirror 707 and a metal layer 709. The surface emitting laser 7 further includes a current confinement layer 723, a lower electrode 741, an upper electrode 742, a contact layer 743, and an etching stop layer 744. The lower reflecting mirror 702 is provided on the substrate 701. The lower spacer layer 703 is provided on the lower reflecting mirror 702. The active layer 704 is provided on the lower spacer layer 703. The upper spacer layer 705 is provided on the active layer 704. The multilayer-film reflecting mirror 707 is provided on the upper spacer layer 705. The etching stop layer 744 is provided on the multilayer-film reflecting mirror 707. The lower spacer layer 703, the active layer 704, and the upper spacer layer 705 define a resonator 706. The metal layer 709 is provided on an emission surface 710 of the multilayer-film reflecting mirror 707 via the etching stop layer 744. The emission surface 710 is located on a side opposite to the resonator 706.

The substrate 701 is, for example, a GaAs substrate.

The lower reflecting mirror 702 is, for example, a multilayer-film reflecting mirror including a semiconductor including 55.5 periods of high refractive-index layers and low refractive-index layers. For example, the high refractive-index layers each are an $Al_{0.50}Ga_{0.50}As$ layer, and the low refractive-index layers each are an $Al_{0.95}Ga_{0.05}As$ layer. The optical thickness of one period of the high refractive-index layer and the low refractive-index layer is $\lambda/2$.

The multilayer-film reflecting mirror 707 has a configuration similar to that of the multilayer-film reflecting mirror 107. That is, the multilayer-film reflecting mirror 707 includes a low refractive-index layer and a high refractive-index layer, and the low refractive-index layer and the high refractive-index layer are alternately stacked. The low refractive-index layer has a first refractive index. The high refractive-index layer has a second refractive index higher than the first refractive index. The multilayer-film reflecting mirror 707 is, for example, a multilayer-film reflecting mirror including a semiconductor including 34.5 periods of high refractive-index layers and low refractive-index layers. For example, the high refractive-index layers each are an $Al_{0.50}Ga_{0.50}As$ layer, and the low refractive-index layers each are an $Al_{0.95}Ga_{0.05}As$ layer. The optical thickness of one period of the high refractive-index layer and the low refractive-index layer is $\lambda/2$. For example, the multilayer-film reflecting mirror 707 includes 34 $Al_{0.50}Ga_{0.50}As$ layers and 35 $Al_{0.95}Ga_{0.05}As$ layers.

The active layer 704 has a multiple quantum well structure including a plurality of gallium indium phosphide (GaInP) layers and a plurality of aluminum gallium indium phosphide (AlGaInP) layers. The lower spacer layer 703 is an n-type AlGaInP layer. The upper spacer layer 705 is a p-type AlGaInP layer. The etching stop layer 744 is a p-type GaInP layer. The contact layer 743 is a p-type GaAs layer. The contact layer 743, the etching stop layer 744, the multilayer-film reflecting mirror 707, the upper spacer layer 705, the active layer 704, and a portion of the lower spacer layer 703 are etched to form a mesa structure. The thickness of the etching stop layer 744 is about 10 nm, which corresponds to an optical thickness of about $0.05\lambda$.

The current confinement layer 723 includes a conductive region 721 and an insulating region 722. The conductive region 721 is surrounded by the insulating region 722. For example, the current confinement layer 723 is formed such that a low refractive-index layer in the third period from the active layer 704 of the multilayer-film reflecting mirror 707 is an AlAs layer, and the AlAs layer is oxidized with water vapor. That is, for example, the conductive region 721 is an AlAs layer (low refractive-index layer), and the insulating region 722 is an $A_xO_y$ layer. The current confinement layer 723 limits a region in the active layer 704 through which a current flows. When carriers are injected into the active layer 704, a standing wave 732 of light is generated in a direction perpendicular to a substrate surface (principal surface) of the substrate 701 with a wavelength $\lambda$ (650 nm) determined by the resonator 706. In the seventh embodiment, light is emitted toward the multilayer-film reflecting mirror 707 while the center of a region of the active layer 704 overlapping the conductive region 721 in a plan view serves as an emission center 720.

FIG. 18 schematically illustrates the positions of an antinode and a node of the standing wave 732. In the seventh embodiment, the resonator 706 has a thickness with which the standing wave 732 with a wavelength $\lambda$ of 650 nm is generated. To obtain a high gain, the active layer 704 is situated at an antinode of the standing wave 732 having a high light intensity. Anode of the standing wave 732 is at the emission surface 710 of the multilayer-film reflecting mirror 707. For example, a low refractive-index layer having an optical thickness of $\lambda/4$ defines the emission surface 710. That is, the multilayer-film reflecting mirror 707 is terminated at the low refractive-index layer ($Al_{0.95}Ga_{0.05}As$ layer) in an emission direction of light.

The emission surface 710 of the multilayer-film reflecting mirror 707 has an emission region 713 from which light generated in the active layer 704 is emitted. The emission region 713 includes a first region 711 including the emission center 720 in a plan view, and a second region 712 located around the first region 711. For example, the second region 712 surrounds the first region 711. For example, the first region 711 is a circular region, and the second region 712 is a ring-shaped region. The first region 711 is a region in which the light intensity of a fundamental mode 731 in a transverse direction including the emission center 720 is high.

The metal layer 709 is provided in the first region 711 via the etching stop layer 744, and absorbs a portion of the light generated in the active layer 704. The metal layer 709 is, for example, a Cr layer.

The metal layer 709 has a thickness of, for example, 40 nm.

The lower electrode 741 includes a gold germanium (AuGe) alloy layer in direct contact with the substrate 701, a nickel (Ni) layer below the AuGe alloy layer, and an Au layer below the Ni layer. The upper electrode 742 includes a gold zinc (AuZn) alloy layer formed on the contact layer 743 and an Au layer on the AuZn alloy layer.

When a voltage is applied between the lower electrode 741 and the upper electrode 742, a current flows through the active layer 704.

In the seventh embodiment, the reflectivity of a portion of the upper reflecting mirror 708 overlapping the first region 711 in a plan view as viewed from the active layer 704 is higher than the reflectivity of a portion of the upper reflecting mirror 708 overlapping the second region 712 in the plan view as viewed from the active layer 704. For example, the reflectivity of the portion of the upper reflecting mirror 708 overlapping the first region 711 in the plan view as viewed from the active layer 704 is 0.9929, and the reflectivity of the portion of the upper reflecting mirror 708 overlapping the second region 712 in the plan view as viewed from the active layer 704 is 0.9837. Thus, the oscillation threshold value of a high-order mode is higher than the oscillation threshold value of a single mode in an in-plane transverse direction, and the surface emitting laser 7 operates in the single mode. Also, since the metal layer 709 absorbs the portion of the light, the optical output of the surface emitting laser 7 can be suppressed. For example, the optical output of the surface emitting laser 7 can be about sub-microwatts to about several tens of microwatts, which is suitable for eye-safe use. That is, according to the seventh embodiment, both eye-safe use and single-mode operation can be attained.

A method for manufacturing the surface emitting laser 7 according to the seventh embodiment is described next.

First, the lower reflecting mirror 702, the lower spacer layer 703, the active layer 704, the upper spacer layer 705, the upper reflecting mirror 708, the etching stop layer 744, and the contact layer 743 are formed on the substrate 701 using a MOCVD apparatus.

Then, a mesa structure is formed in the contact layer 743, the etching stop layer 744, the upper reflecting mirror 708, the upper spacer layer 705, the active layer 704, and a portion of the lower spacer layer 703 by photolithography and dry etching so that a portion of the lower spacer layer 703 remains in a thickness direction.

Then, the AlAs layer in the upper reflecting mirror 708 is selectively oxidized by water vapor oxidation to form the current confinement layer 723.

Then, the entire wafer is passivated with an insulating film (illustration being omitted), and the insulating film at an upper portion of the mesa structure is removed. Then, the contact layer 743 is etched until the etching stop layer 744 is exposed, and an opening is formed in the contact layer 743. Then, the metal layer 709 is formed on the etching stop layer 744 in a region with a high light intensity of the fundamental mode 731 in the transverse direction, that is, the first region 711 in the opening. The lower electrode 741 is formed on the back surface of the substrate 701. The upper electrode 742 is formed on the contact layer 743.

In this way, it is possible to manufacture the surface emitting laser 7 according to the seventh embodiment.

The metal layer 709 may be made of another kind of metal that can provide ohmic contact, and the metal layer may be formed in the second region 712 to a thickness with which the reflectivity is not excessively increased. In this case, the metal layer 709 and the metal layer formed in the second region 712 can function as an upper electrode.

With this structure, compared to a structure of related art in which an upper electrode is formed outside an emission region, a current is likely to be uniformly injected to the emission region due to the metal layer, and single-mode operation is likely to be performed in the transverse direction.

A light emitting element (1; 2; 3; 4; 5; 6; or 7) includes an active layer (104; 404; or 704) configured to generate light; and a first reflecting mirror (108; 208; 308; 408; 508; 608; or 708) over the active layer (104; 404; or 704). The first reflecting mirror (108; 208; 308; 408; 508; 608; or 708) includes a multilayer-film reflecting mirror (107; 207; 307; 407; 507; 607; or 707) and a first layer on a first surface of the multilayer-film reflecting mirror (107; 207; 307; 407; 507; 607; or 707) opposite to a second surface of the multilayer-film reflecting mirror (107; 207; 307; 407; 507; 607; or 707) over the active layer (104; 404; or 704) (i.e. the second surface is closer to the active layer (104; 404; or 704) than the first surface). The multilayer-film reflecting mirror (107; 207; 307; 407; 507; 607; or 707) includes a first refractive-index layer having a first refractive index; and a second refractive-index layer having a second refractive index higher than the first refractive index. The first refractive-index layer and the second refractive-index layer are alternately stacked. The first surface has an emission region from which the light generated in the active layer (104; 404; or 704) is emitted. The first layer is in the emission region of the first surface and is configured to absorb a portion of the light emitted from the first surface and transmit another portion of the light through the first layer. The phrase "the first reflecting mirror (108; 208; 308; 408; 508; 608; or 708) over the active layer (104; 404; or 704)" refers to the first reflecting mirror may directly contact the active layer (104; 404; or 704) or may not contact the active layer (104; 404; or 704) so that a spacer layer is between the second surface and the active layer.

Sixth Calculation Example

Figure 19A:
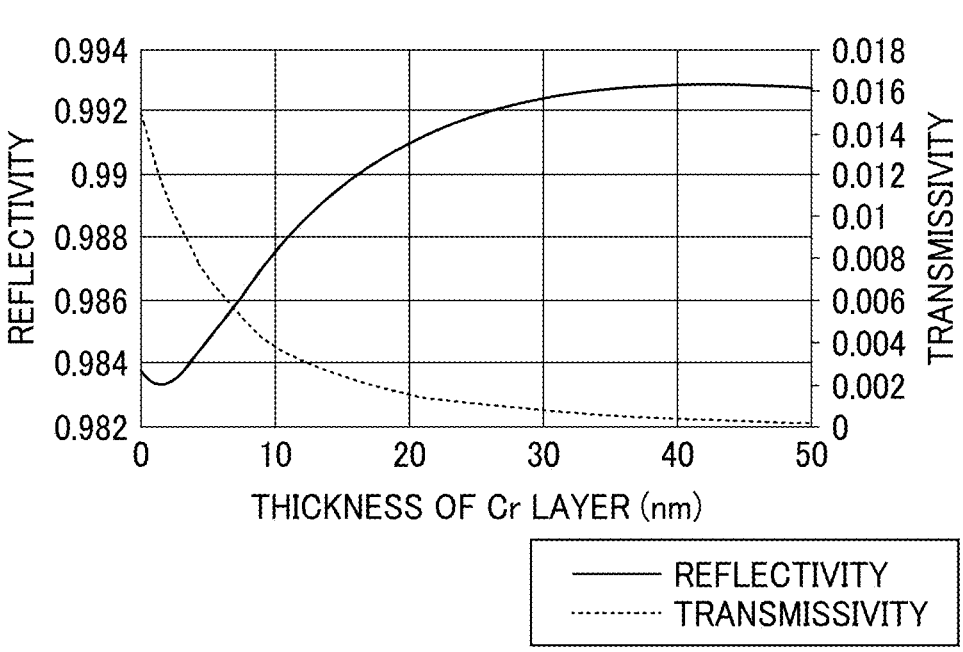
FIGS. 19A and 19B are graphs presenting results of a sixth calculation example according to the seventh embodiment.
Figure 19B:
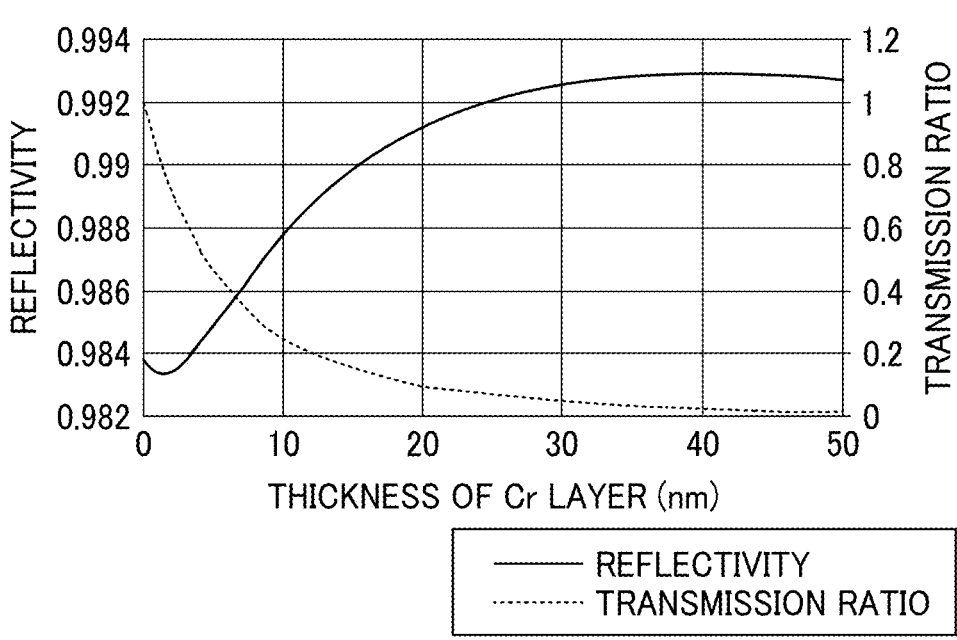

Next, a calculation example (sixth calculation example) performed according to the seventh embodiment is described. In the sixth calculation example, a stacked body including the lower reflecting mirror 702, the resonator 706, the multilayer-film reflecting mirror 707, and the metal layer 709 according to the seventh embodiment was used as a model. It is assumed that each layer was formed in a solid form. The multilayer-film reflecting mirror 707 is a multilayer-film reflecting mirror of a dielectric body with 34.5 periods, the emission surface 710 is terminated at the low refractive-index layer, and the emission surface 710 is situated at a node of the standing wave 732. The reflectivity of the upper reflecting mirror 708 and the transmissivity of the upper reflecting mirror 708 as viewed from the active layer 704 were calculated when the thickness of the Cr layer serving as the metal layer 709 was changed. FIGS. 19A and 19B present the results. FIG. 19A presents the relationship between the thickness of the Cr layer and the reflectivity and transmissivity of the upper reflecting mirror 708. FIG. 19B presents the relationship between the thickness of the Cr layer and the transmission ratio of the upper reflecting mirror 708, which is derived from FIG. 19A.

In this case, the calculation was performed based on an assumption that the refractive index of $Al_{0.50}Ga_{0.50}As$ was 3.32, the refractive index of $Al_{0.9}Ga_{0.05}As$ was 3.05, the refractive index of GaInP was 3.35, and the complex refractive index of Cr was 3.1+3.33i. As presented in FIGS. 19A and 19B, the reflectivity slightly decreases as the thickness of the Cr layer increases in a range from 0 nm to 1 or 2 nm of the thickness of the Cr layer, whereas the reflectivity increases as the thickness of the Cr layer increases in that range or more. As described above, when the Cr layer having a thickness of 2 nm or more is formed, the reflectivity can be increased and the optical output can be weakened through absorption by the Cr layer. When the thickness of the Cr layer was 40 nm, the reflection ratio was 1.00931 and the transmission ratio was 0.0303.

The reflection ratio varies depending on the number of pairs (periods) of high and low refractive-index layers of the multilayer-film reflecting mirror, and the refractive index, reflectivity, thickness, and so forth of the first layer. There may be a case of a thickness of the first layer with which the reflection ratio is less than 1 (FIGS. 7, 8, 13A, 13B, 16, 19A, 19B, and so forth). Even in such a case, the thickness of the first layer is desirably adjusted so that the reflection ratio is 1 or more. When the second region having a small reflectivity is provided around the first region provided with the first layer, the thickness of the first layer is determined so that the reflectivity ratio is 1 or more, and hence the difference in reflectivity between the first region and the second region can be further increased.

The transmission ratio decreases as the thickness of the first layer increases. In an embodiment of the present disclosure, when a Cr layer having a thickness of about 10 nm to about 20 nm or an Al layer having a thickness of about 20 nm to about 30 nm is formed as the first layer, the transmission ratio can be 0.1 or less, and a light emitting element with a lower output can be provided.

Eighth Embodiment

Figure 20:
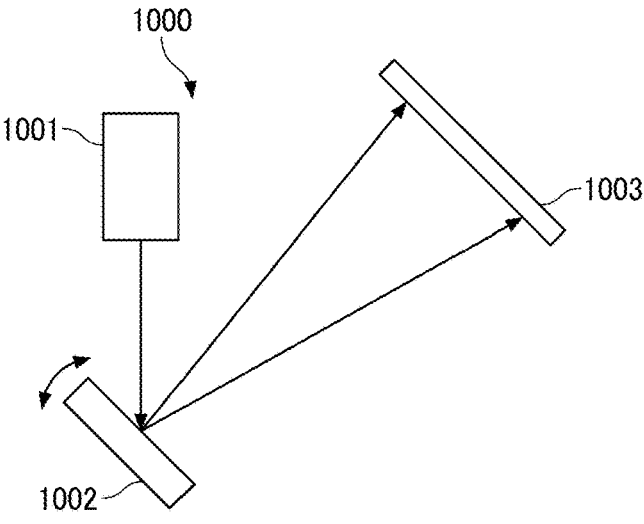
FIG. 20 is an illustration of an example configuration of a projection device according to an eighth embodiment.

Next, a projection device is described according to an eighth embodiment with reference to FIG. 20. FIG. 20 is an illustration of a configuration of a projection device 1000 according to the present embodiment. The projection device 1000 can draw an image by scanning with its laser beam.

As illustrated in FIG. 20, the projection device 1000 includes a light source 1001 and an optical scanner 1002. The light source 1001 includes one or two or more surface emitting lasers according to any one of the first to seventh embodiments and the modifications thereof.

When the light source 1001 includes one surface emitting laser, the projection device 1000 projects a monochrome image on an object 1003. When the light source 1001 includes two or more surface emitting lasers, the projection device 1000 coaxially aligns the optical axes of the respective surface emitting lasers to emit light from the emission surfaces, and changes the oscillation wavelengths for the respective surface emitting lasers to project images of a plurality of colors on the object 1003.

The optical scanner 1002 includes an element that scans the object 1003 with a laser beam emitted from the light source 1001 so as to project an image onto the object 1003. Such an element is, for example, a biaxially movable micro electro mechanical systems (MEMS) mirror or a unit including two uniaxially movable MEMS mirrors. The optical scanner 1002 is an example of an optical element that adjusts the direction of travel of the laser beam emitted from the light source 1001.

During the scanning by the optical scanner 1002, the optical scanner 1002 irradiates the object 1003 with the laser beam while modulating its intensity, to generate an image. Thus, the optical scanner 1002 generates an image directly on the object 1003.

Ninth Embodiment

Figure 21:
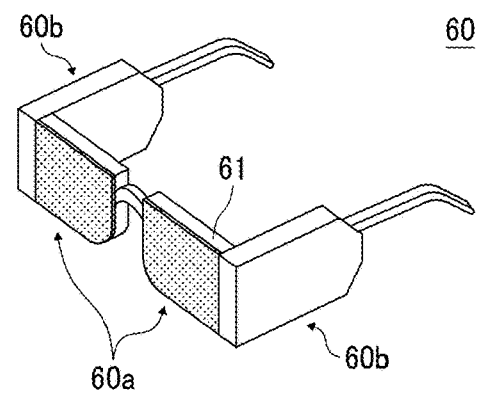
FIG. 21 is a perspective view of an example configuration of a head-mounted display (HMD) according to a ninth embodiment.
Figure 22:
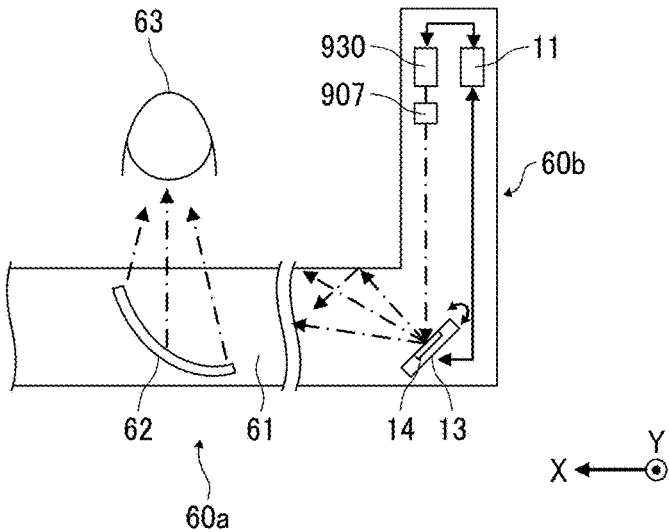
FIG. 22 is a cross-sectional view of an example configuration of the HMD according to the ninth embodiment.

Next, a head-mounted display according to a ninth embodiment is described with reference to FIGS. 21 and 22. FIG. 21 is a perspective view of an example configuration of a head-mounted display 60 according to the present embodiment. FIG. 22 is a cross-sectional view of the example configuration of the head-mounted display 60.

The head-mounted display 60 is an example of a head-mounted display device that can be mounted on a human head, and can be shaped like, for example, glasses. In the following description, the head-mounted display is abbreviated as HMD.

In FIG. 21, the HMD 60 includes a pair of a front 60a and a temple 60b provided substantially symmetrically on each of the left and right. The front 60a can include, for example, alight guide plate 61. An optical system, a control device, and so forth, can be incorporated in the temple 60b.

FIG. 22 is a partial view of the configuration of the HMD 60. FIG. 22 illustrates a configuration for the left eye. The HMD 60 has the same configuration for the right eye.

The HMD 60 includes a control device 11, a light source unit 930, a light-intensity adjuster 907, a movable device 13 with a reflecting surface 14, a light guide plate 61, and a semi-reflective mirror 62. The HMD 60 is an example of a display device.

The light source unit 930 includes a red laser beam source, a green laser beam source, a blue laser beam source, a plurality of collimator lenses, and a plurality of dichroic mirrors, which are combined as a single unit in an optical housing. In the light source unit 930, the laser beams of the three colors from the red laser beam source, the green laser beam source, and the blue laser beam source are combined by the dichroic mirrors serving as a combiner. The light source unit 930 emits combined parallel light. The light source unit 930 is an example of a light source device.

The red laser beam source includes one or two or more surface emitting lasers according to any one of the first to seventh embodiments and the modifications thereof, and emits a red laser beam. The green laser beam source includes one or two or more surface emitting lasers according to any one of the first to seventh embodiments and the modifications thereof, and emits a green laser beam. The blue laser beam source includes one or two or more surface emitting lasers according to any one of the first to seventh embodiments and the modifications thereof, and emits a blue laser beam. While the oscillation wavelength is specified in any one of the fourth to seventh embodiments and the modifications thereof, the oscillation wavelength can be changed by selecting the material and the optical thickness of the semiconductor layer.

The light intensity of the combined light from the light source unit 930 is adjusted by the light-intensity adjuster 907, and then the light is incident on the movable device 13. The movable device 13 moves the reflecting surface 14 in the XY direction based on a signal from the control device 11, and performs two-dimensional scanning with the light emitted from the light source unit 930. The driving of the movable device 13 is controlled in synchronization with the light-emitting timings of the red laser beam source, the green laser beam source, and the blue laser beam source.

The scanning light of the movable device 13 is incident on the light guide plate 61. The light guide plate 61 guides the scanning light to the semi-reflective mirror 62 while reflecting the scanning light on the inner wall surface. The light guide plate 61 is formed of a material such as a resin having transmissivity for the wavelength of the scanning light.

The semi-reflective mirror 62 reflects the light from the light guide plate 61 toward the back surface of the HMD 60, and emits the light in the direction of the eye of a wearer 63 of the HMD 60. The semi-reflective mirror 62 has, for example, a free-form surface shape. The image of the scanning light is reflected by the semi-reflective mirror 62, and then is formed on the retina of the wearer 63. The image of the scanning light is formed on the retina of the wearer 63 due to the reflection at the semi-reflective mirror 62 and the effect of the crystalline lens of the eyeball. Moreover, due to the reflection at the semi-reflective mirror 62, the spatial distortion of the image is corrected. The wearer 63 can visually identify an image formed with the light that is scanned in the XY direction.

The wearer 63 visually identify an image of external light superposed on the image of the scanning light because the semi-reflective mirror 62 is used. Alternatively, a mirror may be provided instead of the semi-reflective mirror 62 to block out external light and enable the wearer 63 to visually identify the image of the scanning light.

In the present embodiment, compared to a case where an edge-emission laser is used as a light source, a compact and lightweight HMD with a reduced number of components such as a ND filter and a low power consumption can be provided.

Tenth Embodiment

Figure 23:
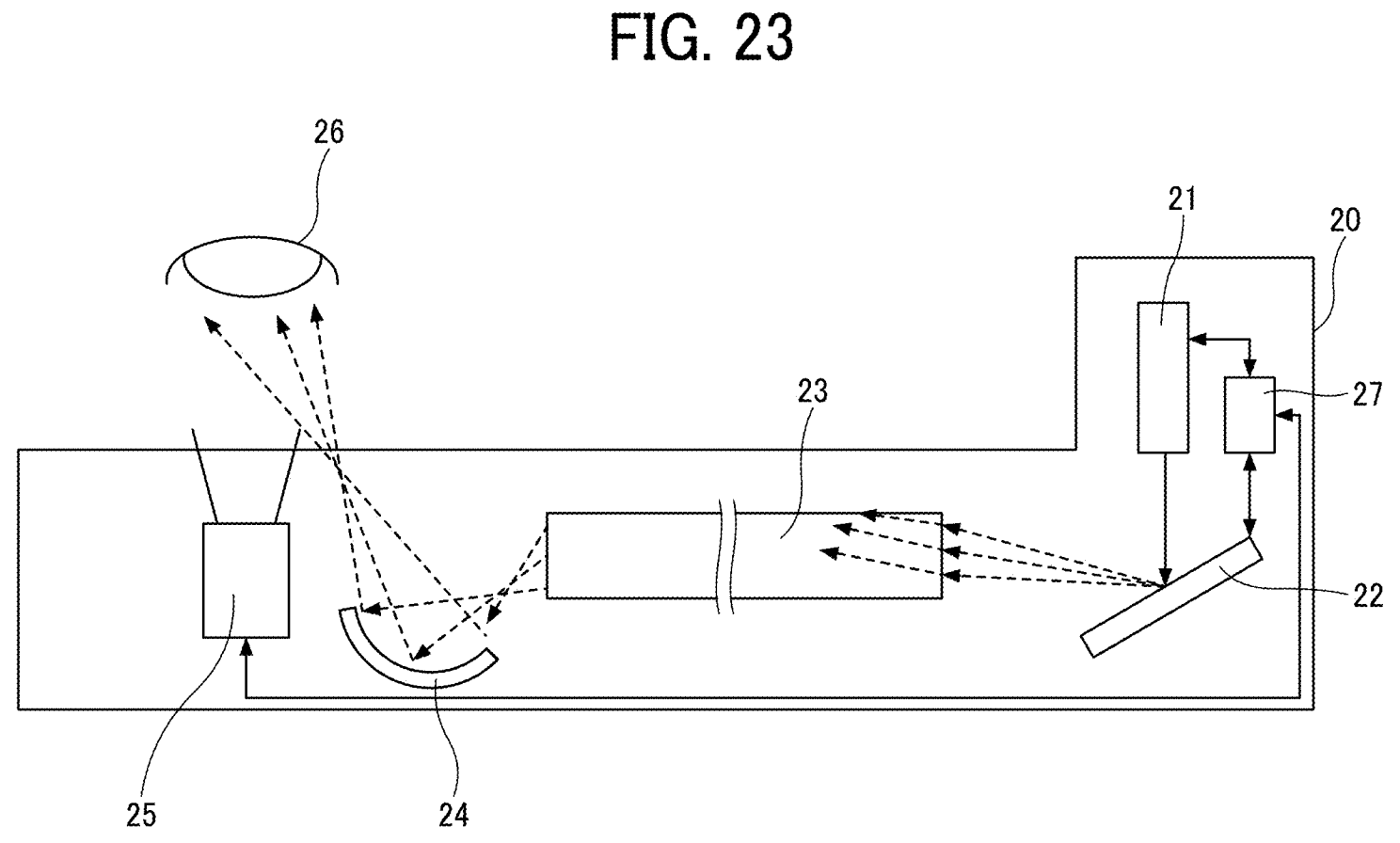

Next, a biometric authentication apparatus using a pupil-response of a person according to a tenth embodiment is described next with reference to FIG. 23. FIG. 23 is an illustration of an example configuration of a biometric authentication apparatus 20 according to the present embodiment. The biometric authentication apparatus 20 includes a light source 21, an optical scanner 22, a first optical element 23, a second optical element 24, an imaging element 25, and a control device 27. The light source 21 includes one or two or more surface emitting lasers according to any one of the first to seventh embodiments and the modifications thereof. Light emitted from the light source 21 is incident on the optical scanner 22. The optical scanner 22 moves the reflecting surface based on a signal from the control device 27 to perform scanning with the light from the light source 21. The scanning light of the optical scanner 22 is emitted on an eye 26 via the first optical element 23 and the second optical element 24. The size of the pupil is controlled with the intensity of the light emitted on the eye 26, and iris information is acquired by the imaging element 25. The control device 27 acquires information on the eye 26 of a person (living body) based on the output of the imaging element 25. The biometric authentication apparatus 20 is an example of a biological information acquisition apparatus. The light source 21 is an example of a light source device. The imaging element 25 is an example of a light receiving device. The control device 27 is an example of an information acquirer.

For example, the first optical element 23 is a waveguide that guides the light of scanning performed by the optical scanner 22 to the second optical element 24. The second optical element 24 is a mirror that changes the path of the light emitted from the first optical element 23 to the eye 26. While the two separate optical elements have been described in the present embodiment, another method may be used as long as an optical element emits scanning light to the eye 26.

The light source 21 may include a plurality of elements, and is, for example, a module with the elements mounted to coaxially emit laser beams with four wavelengths of red, blue, green, and infrared. Since the pupil reacts more sensitively to the wavelengths of blue and green than to the other wavelengths, the wavelengths of blue and green can further narrow the pupil to obtain fine iris information. Moreover, when multiple wavelengths are used, biological information on a wavelength basis of the iris is obtained, and authentication accuracy is further improved.

Using the surface emitting laser according to any one of the first to seventh embodiments and the modifications thereof can provide the eye-safe and highly accurate biometric authentication apparatus 20 without a filter for weakening the optical output.

Although the desirable embodiments and so forth have been described in detail, the present disclosure is not limited to the above-described embodiments and so forth, and various modifications and substitutions can be made without departing from the scope and spirit of the present disclosure as set forth in the claims.

The invention claimed is:

1. A light emitting element comprising:
an active layer configured to generate light; and
a first reflecting mirror over the active layer, the first reflecting mirror including:
a multilayer-film reflecting mirror having a first surface and a second surface opposite to the first surface and closer to the active layer than the first surface, the multilayer-film reflecting mirror including:
a first refractive-index layer having a first refractive index; and
a second refractive-index layer having a second refractive index higher than the first refractive index, the first refractive-index layer and the second refractive-index layer alternately stacked; and
a first layer on the first surface of the multilayer-film reflecting mirror,
wherein:
the first surface has an emission region from which the light generated in the active layer is emitted,
the first layer is in the emission region of the first surface and is configured to absorb a portion of the light emitted from the first surface and transmit another portion of the light through the first layer, and
the first layer has a thickness having a reflectivity ratio $R_1/R_0$ of one or more,
where $R_0$ is a reflectivity of the light generated in the active layer and incident from the multilayer-film reflecting mirror on an interface between the multilayer-film reflecting mirror and air assumed to be on the multilayer-film reflecting mirror, and
where $R_1$ is a reflectivity of the light generated in the active layer and incident from the multilayer-film reflecting mirror on an interface between the multilayer-film reflecting mirror and the first layer.

2. The light emitting element according to claim 1, wherein:
the light emitting element is a surface emitting laser and further comprises:
a second reflecting mirror; and
a resonator between the first reflecting mirror and the second reflecting mirror, the resonator including the active layer, and
the emission region includes:
a first region; and
a second region around the first region,
the first layer is in the first region, and
a first reflectivity of a portion of the first reflecting mirror overlapping the first region is higher than a second reflectivity of another portion of the first reflecting mirror overlapping the second region in a plan view of the multilayer film reflecting mirror as viewed from the active layer.

3. The light emitting element according to claim 2, wherein:
a node of a standing wave of a longitudinal mode in the light generated in the active layer is at the first surface of the multilayer-film reflecting mirror in the second region.

4. The light emitting element according to claim 3, wherein;
a phase of the standing wave in the first region differs from a phase of the standing wave in the second region.

5. The light emitting element according to claim 2, wherein;
an antinode of a standing wave of a longitudinal mode in the light generated in the active layer is at the first surface of the multilayer-film reflecting mirror in the second region.

6. The light emitting element according to claim 5, wherein;
a node of the standing wave is at the first surface of the multilayer-film reflecting mirror in the first region.

7. The light emitting element according to claim 2, further comprising:
a second layer in the second region,
wherein at least one of a thickness or a material of the first layer differs from a thickness or a material of the second layer.

8. The light emitting element according to claim 7, wherein;
the first layer is thicker than the second layer.

9. The light emitting element according to claim 7, wherein:
a real part of a complex refractive index of the first layer is lower than a real part of a complex refractive index of the second layer.

10. The light emitting element according to claim 1, further comprising:
a current confinement layer including:
a conductive region; and
an insulating region,
wherein:
an emission center is at a center of a third region in which the active layer and the conductive region overlap in a plan view of the multilayer film reflecting mirror, and
the first layer includes the emission center.

11. A light source device comprising the light emitting element according to claim 1.

12. A display device comprising the light emitting element according to claim 1.

13. A head-mounted display comprising the light emitting element according to claim 1.

14. A biological information acquisition apparatus comprising:
a light source to irradiate a living body with light;
a light receiver to receive reflected light from the living body; and
an information acquirer to acquire information on the living body based on an output of the light receiver,
wherein the light source includes the light emitting element according to claim 1.

15. The light emitting element according to claim 1, wherein:
the first layer is a metal layer.

16. A light emitting element, comprising:

an active layer configured to generate light; and a first reflecting mirror over the active layer, the first reflecting mirror including:

a multilayer-film reflecting mirror having a first surface and a second surface opposite to the first surface and closer to the active layer than the first surface, the multilayer-film reflecting mirror including:

a first refractive-index layer having a first refractive index; and a second refractive-index layer having a second refractive index higher than the first refractive index, the first refractive-index layer and the second refractive-index layer alternately stacked; and a first layer on the first surface of the multilayer-film reflecting mirror, wherein:

the first surface has an emission region from which the light generated in the active layer is emitted, the first layer is in the emission region of the first surface and is configured to absorb a portion of the light emitted from the first surface and transmit another portion of the light through the first layer, and the first layer has a thickness having a transmissivity ratio $I_1/I_0$ of more than 0 and 0.1 or less, where $I_0$ is a transmissivity of the light generated in the active layer transmitted from the multilayer-film reflecting mirror to air assumed to be on the multilayer-film reflecting mirror, and $I_1$ is a transmissivity of the light generated in the active layer transmitted from the multilayer-film reflecting mirror on which the first layer is formed to the air.

17. A light source device comprising the light emitting element according to claim 16.

18. A light emitting element, comprising:

an active layer configured to generate light; and a first reflecting mirror over the active layer, the first reflecting mirror including:

a multilayer-film reflecting mirror having a first surface and a second surface opposite to the first surface and closer to the active layer than the first surface, the multilayer-film reflecting mirror including:

a first refractive-index layer having a first refractive index; and a second refractive-index layer having a second refractive index higher than the first refractive index, the first refractive-index layer and the second refractive-index layer alternately stacked; and a first layer on the first surface of the multilayer-film reflecting mirror, wherein:

the first surface has an emission region from which the light generated in the active layer is emitted, the first layer is in the emission region of the first surface and is configured to absorb a portion of the light emitted from the first surface and transmit another portion of the light through the first layer, and an optical output of the light emitting element is 0.01 μW or more and 100 μW or less.

19. A light source device comprising the light emitting element according to claim 18.

* * * * *